(12) United States Patent
Cho et al.

(10) Patent No.: US 11,127,789 B2
(45) Date of Patent: Sep. 21, 2021

(54) MAGNETIC MEMORY DEVICES

(71) Applicant: Samsung Electronics Co., Ltd., Suwon-si (KR)

(72) Inventors: Han-Na Cho, Seongnam-si (KR); Bok-Yeon Won, Yongin-si (KR); Oik Kwon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/887,541

(22) Filed: May 29, 2020

(65) Prior Publication Data

US 2021/0159272 A1 May 27, 2021

(30) Foreign Application Priority Data

Nov. 22, 2019 (KR) .................. 10-2019-0151643

(51) Int. Cl.
| | |
|---|---|
| *H01L 27/22* | (2006.01) |
| *H01L 43/02* | (2006.01) |
| *H01L 23/528* | (2006.01) |
| *H01L 23/522* | (2006.01) |
| *H01L 43/10* | (2006.01) |

(52) U.S. Cl.
CPC ........ *H01L 27/228* (2013.01); *H01L 23/5226* (2013.01); *H01L 23/5283* (2013.01); *H01L 43/02* (2013.01); *H01L 43/10* (2013.01)

(58) Field of Classification Search
CPC ............... H01L 27/228; H01L 23/5226; H01L 23/5283; H01L 43/02; H01L 43/10
USPC ......................................................... 257/421
See application file for complete search history.

(56) References Cited

U.S. PATENT DOCUMENTS

| | | | |
|---|---|---|---|
| 9,865,649 B2 | 1/2018 | Tan et al. | |
| 9,893,278 B1 | 2/2018 | Chuang et al. | |
| 9,997,563 B2 | 6/2018 | Lee et al. | |
| 10,043,853 B2 | 8/2018 | Sugiura et al. | |
| 10,121,964 B2 | 11/2018 | Tan et al. | |
| 10,199,431 B2 | 2/2019 | Jeong | |
| 2017/0324025 A1 | 11/2017 | Lee et al. | |
| 2018/0350875 A1 | 12/2018 | Han et al. | |
| 2018/0351081 A1 | 12/2018 | Sung et al. | |
| 2019/0148633 A1 | 5/2019 | Dai et al. | |
| 2019/0165041 A1 | 5/2019 | Chuang et al. | |
| 2021/0091139 A1* | 3/2021 | Tseng ............... | H01L 27/228 |

* cited by examiner

*Primary Examiner* — Tu-Tu V Ho
(74) *Attorney, Agent, or Firm* — Harness, Dickey & Pierce, P.L.C.

(57) ABSTRACT

A magnetic memory device includes a substrate including a cell region and a peripheral circuit region, lower contact plugs on the cell region, data storage structures on the lower contact plugs, and a peripheral interconnection structure on the peripheral circuit region. The peripheral interconnection structure includes a line portion extending in a direction parallel to a top surface of the substrate, and contact portions extending from the line portion toward the substrate. A height of each of the contact portions is less than a height of each of the lower contact plugs.

20 Claims, 20 Drawing Sheets

MAGNETIC MEMORY DEVICES

CROSS-REFERENCE TO RELATED APPLICATION

This U.S. non-provisional patent application claims priority under 35 U.S.C. § 119 to Korean Patent Application No. 10-2019-0151643, filed on Nov. 22, 2019, in the Korean Intellectual Property Office, the disclosure of which is hereby incorporated by reference in its entirety.

BACKGROUND

Example embodiments of the inventive concepts relate to magnetic memory devices and, more particularly, to magnetic memory devices including a magnetic tunnel junction.

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. Magnetic memory devices may emerge as next-generation semiconductor memory devices because of their high-speed and/or non-volatile characteristics.

In general, a magnetic memory device may include a magnetic tunnel junction (MTJ) pattern. The magnetic tunnel junction pattern may include two magnetic layers and an insulating layer disposed between the two magnetic layers. A resistance value of the magnetic tunnel junction pattern may be changed depending on magnetization directions of the two magnetic layers. For example, when the magnetization directions of the two magnetic layers are anti-parallel to each other, the magnetic tunnel junction pattern may have a relatively high resistance value. When the magnetization directions of the two magnetic layers are parallel to each other, the magnetic tunnel junction pattern may have a relatively low resistance value. The magnetic memory device may write/read data using a difference between the resistance values of the magnetic tunnel junction pattern.

Highly integrated and/or low-power magnetic memory devices have been increasingly demanded with the development of an electronic industry. Thus, various researches are being conducted to satisfy these demands.

SUMMARY

Some example embodiments of the inventive concepts may provide a magnetic memory device with improved electrical characteristics.

In some example embodiments, a magnetic memory device may include a substrate including a cell region and a peripheral circuit region, lower contact plugs on the cell region, data storage structures on the lower contact plugs, and a peripheral interconnection structure on the peripheral circuit region. The peripheral interconnection structure may include a line portion extending in a direction parallel to a top surface of the substrate, and contact portions extending from the line portion toward the substrate. A height of each of the contact portions may be less than a height of each of the lower contact plugs.

In some example embodiments, a magnetic memory device may include a substrate including a cell region and a peripheral circuit region, an etch stop layer on the cell region and the peripheral circuit region, a first lower interlayer insulating layer on the etch stop layer, a data storage structure on the first lower interlayer insulating layer on the cell region, a first upper interlayer insulating layer on the cell region and the peripheral circuit region and covering the data storage structure, a protective insulating layer between a sidewall of the data storage structure and the first upper interlayer insulating layer and between a top surface of the first lower interlayer insulating layer and the first upper interlayer insulating layer on the cell region, and a peripheral interconnection structure penetrating the first upper interlayer insulating layer and the first lower interlayer insulating layer on the peripheral circuit region. The peripheral interconnection structure may include a line portion extending in a horizontal direction parallel to a top surface of the substrate, and contact portions extending from the line portion toward the substrate. The contact portions may be spaced apart from each other in the horizontal direction by an insulating pattern therebetween, and the insulating pattern may include a portion of the first upper interlayer insulating layer, a portion of the first lower interlayer insulating layer, and a portion of the etch stop layer. The first lower interlayer insulating layer and the first upper interlayer insulating layer on the cell region may have recessed top surfaces. A distance between a top surface of the first lower interlayer insulating layer and a top surface of the first upper interlayer insulating layer on the peripheral circuit region may be less than a maximum value of a distance between the recessed top surface of the first lower interlayer insulating layer and the recessed top surface of the first upper interlayer insulating layer on the cell region.

In some example embodiments, a magnetic memory device may include a substrate including a cell region and a peripheral circuit region, a first lower interlayer insulating layer on the cell region and the peripheral circuit region, a data storage structure on the first lower interlayer insulating layer on the cell region, a first upper interlayer insulating layer on the cell region and the peripheral circuit region and covering the data storage structure, a protective insulating layer between a sidewall of the data storage structure and the first upper interlayer insulating layer and between a top surface of the first lower interlayer insulating layer and the first upper interlayer insulating layer on the cell region, and a peripheral interconnection structure penetrating the first upper interlayer insulating layer and the first lower interlayer insulating layer on the peripheral circuit region. The peripheral interconnection structure may include a line portion extending in a horizontal direction parallel to a top surface of the substrate, and contact portions extending from the line portion toward the substrate. The contact portions may be spaced apart from each other in the horizontal direction by an insulating pattern therebetween, and the insulating pattern may include a portion of the first upper interlayer insulating layer and a portion of the first lower interlayer insulating layer. A level of a top of the portion of the first upper interlayer insulating layer may be closer to a level of a bottom surface of the first upper interlayer insulating layer adjacent to the peripheral interconnection structure than to a level of a top surface of the first upper interlayer insulating layer adjacent to the peripheral interconnection structure.

BRIEF DESCRIPTION OF THE DRAWINGS

The inventive concepts will become more apparent in view of the attached drawings and accompanying detailed description.

DETAILED DESCRIPTION

Hereinafter, some example embodiments of the inventive concepts will be described in detail with reference to the accompanying drawings.

Figure 1:
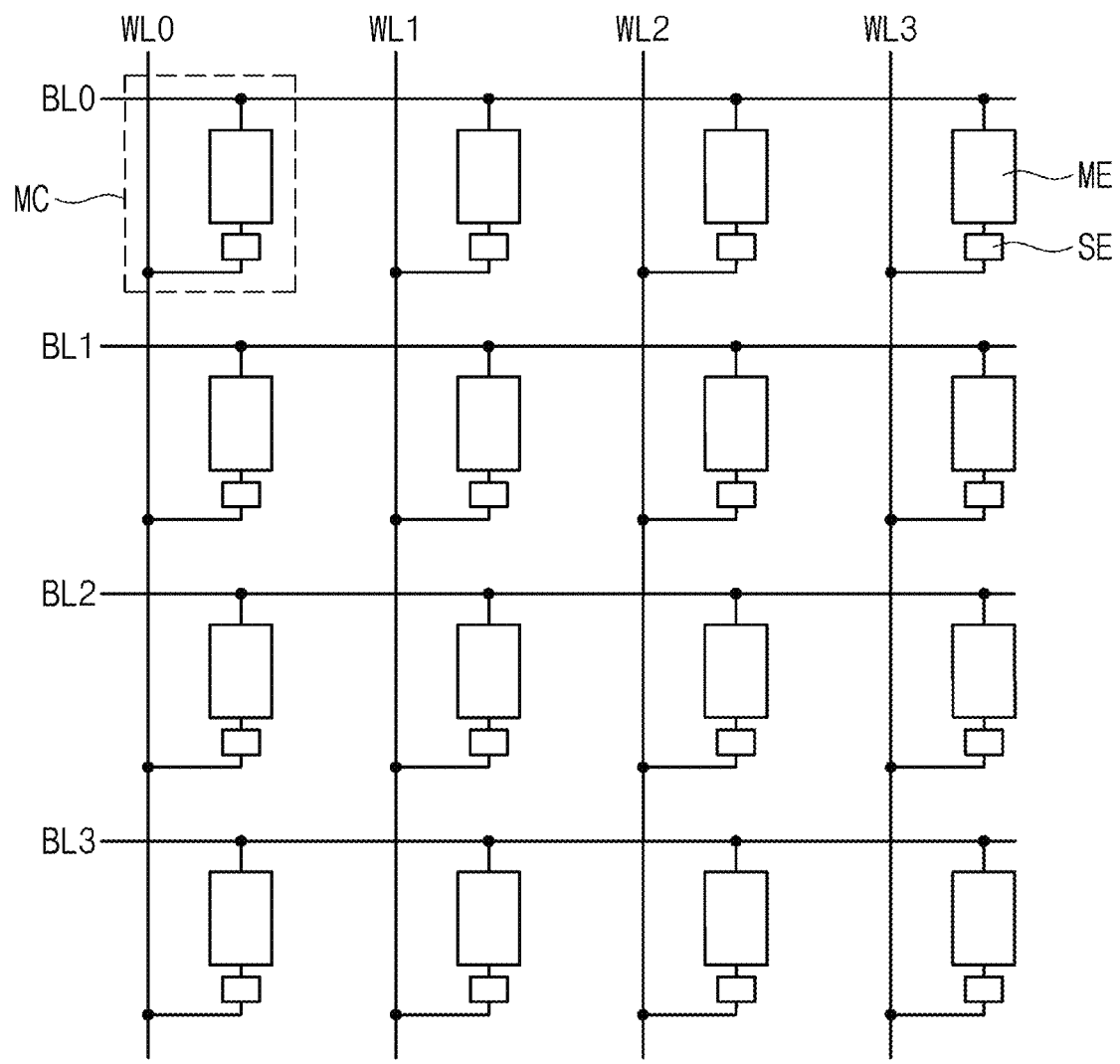
FIG. 1 is a circuit diagram illustrating a memory cell array of a magnetic memory device according to some example embodiments of the inventive concepts.
Figure 2:
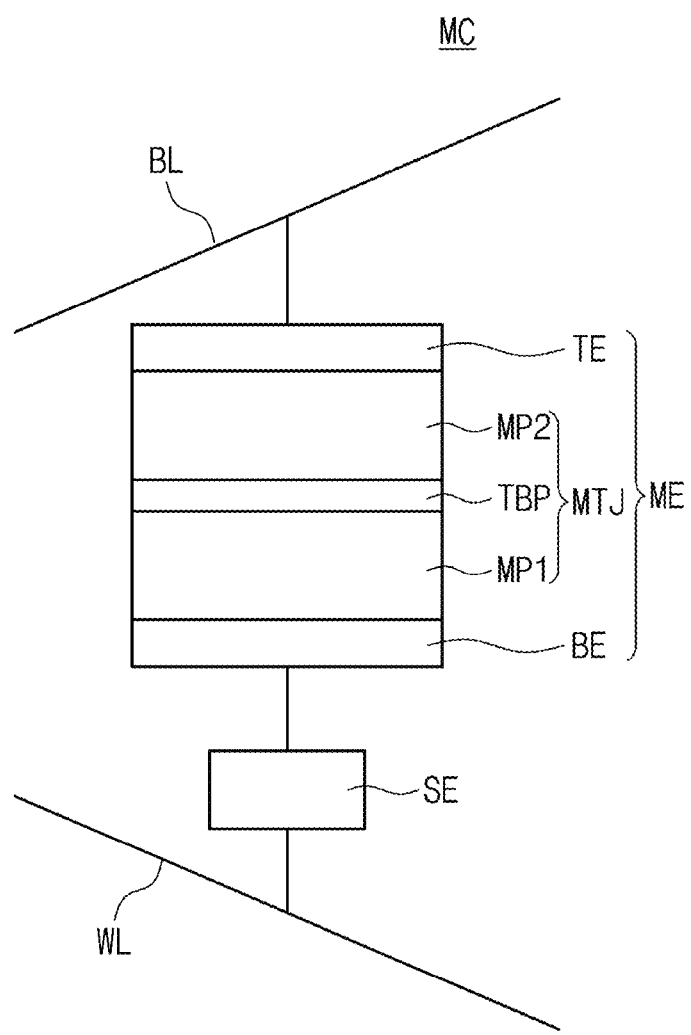
FIG. 2 is a circuit diagram illustrating a unit memory cell of a magnetic memory device according to some example embodiments of the inventive concepts.

FIG. 1 is a circuit diagram illustrating a memory cell array of a magnetic memory device according to some example embodiments of the inventive concepts, and FIG. 2 is a circuit diagram illustrating a unit memory cell of a magnetic memory device according to some example embodiments of the inventive concepts.

Referring to FIGS. 1 and 2, a memory cell array 10 may include a plurality of word lines WL0 to WL3, a plurality of bit lines BL0 to BL3, and unit memory cells MC. The unit memory cells MC may be two-dimensionally or three-dimensionally arranged. The bit lines BL0 to BL3 may intersect the word lines WL0 to WL3. Each of the unit memory cells MC may be connected to a corresponding one of the word lines WL0 to WL3 and a corresponding one of the bit lines BL0 to BL3. Each of the word lines WL0 to WL3 may be connected to a plurality of the unit memory cells MC. The unit memory cells MC connected to one of the word lines WL0 to WL3 may be connected to the bit lines BL0 to BL3, respectively, and the unit memory cells MC connected to one of the bit lines BL0 to BL3 may be connected to the word lines WL0 to WL3, respectively. Each of the unit memory cells MC connected to one of the word lines WL0 to WL3 may be connected to a read and write circuit through each of the bit lines BL0 to BL3.

Each of the unit memory cells MC may include a memory element ME and a selection element SE. The memory element ME may be connected between the bit line BL and the selection element SE, and the selection element SE may be connected between the memory element ME and the word line WL. The memory element ME may be a variable resistance element of which a resistance state is switchable between two different resistance states by an electrical pulse applied thereto. The memory element ME may have a thin layer structure of which an electrical resistance is changeable using spin-transfer torque of electrons of a program current passing therethrough. The memory element ME may have a thin layer structure showing a magnetoresistance property and may include at least one ferromagnetic material and/or at least one anti-ferromagnetic material. The selection element SE may selectively control a flow of charges passing through the memory element ME. For example, the selection element SE may be a diode, a PNP bipolar transistor, an NPN bipolar transistor, an NMOS field effect transistor, or a PMOS field effect transistor. When the selection element SE is a three-terminal element (e.g., the bipolar transistor or the MOS field effect transistor), an additional interconnection line (not shown) may be connected to the selection element SE.

The memory element ME may include a magnetic tunnel junction MTJ. The magnetic tunnel junction MTJ may include a first magnetic pattern MP1, a second magnetic pattern MP2, and a tunnel barrier pattern TBP disposed between the first and second magnetic patterns MP1 and MP2.

Figure 3:
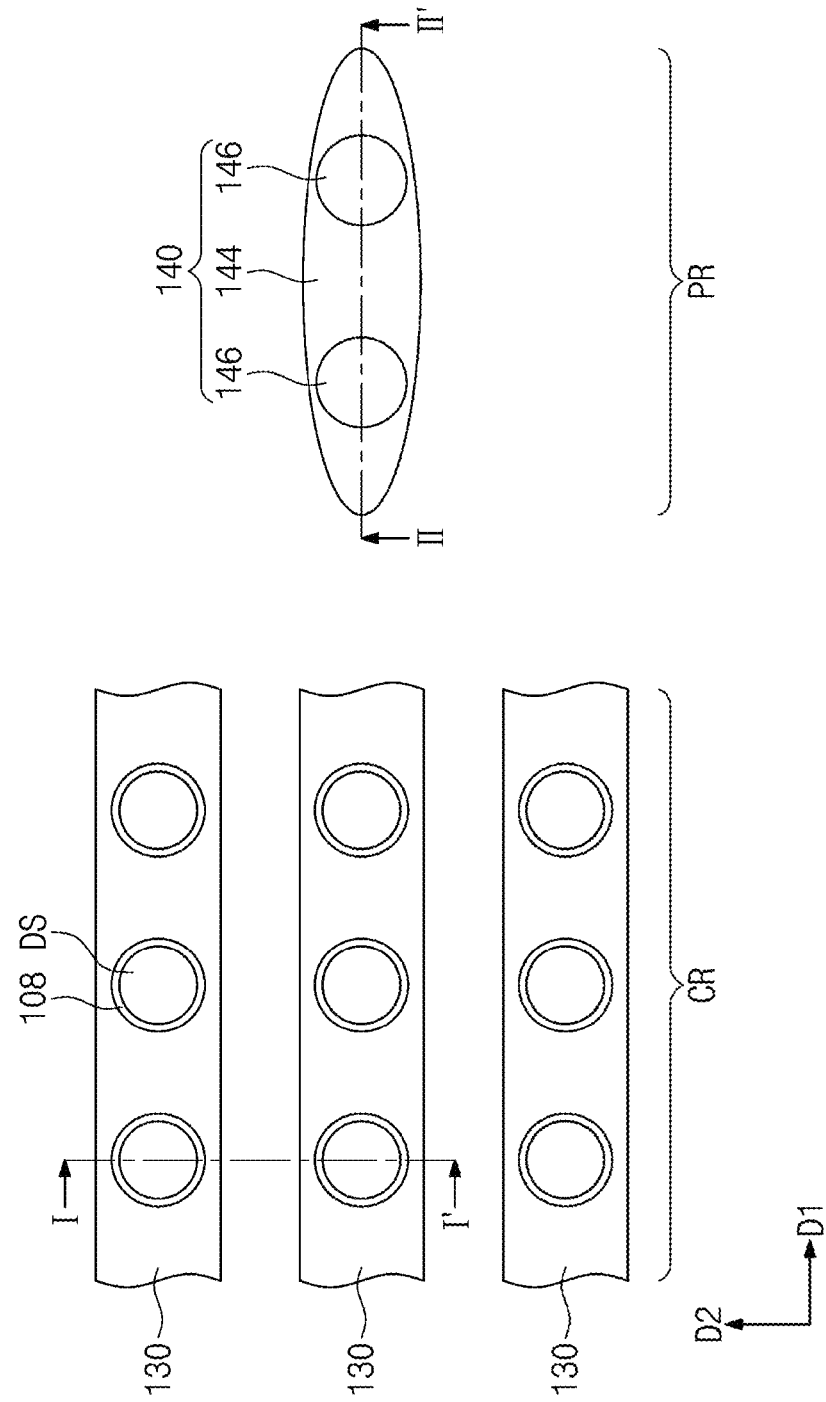
FIG. 3 is a plan view illustrating a magnetic memory device according to some example embodiments of the inventive concepts.
Figure 4:
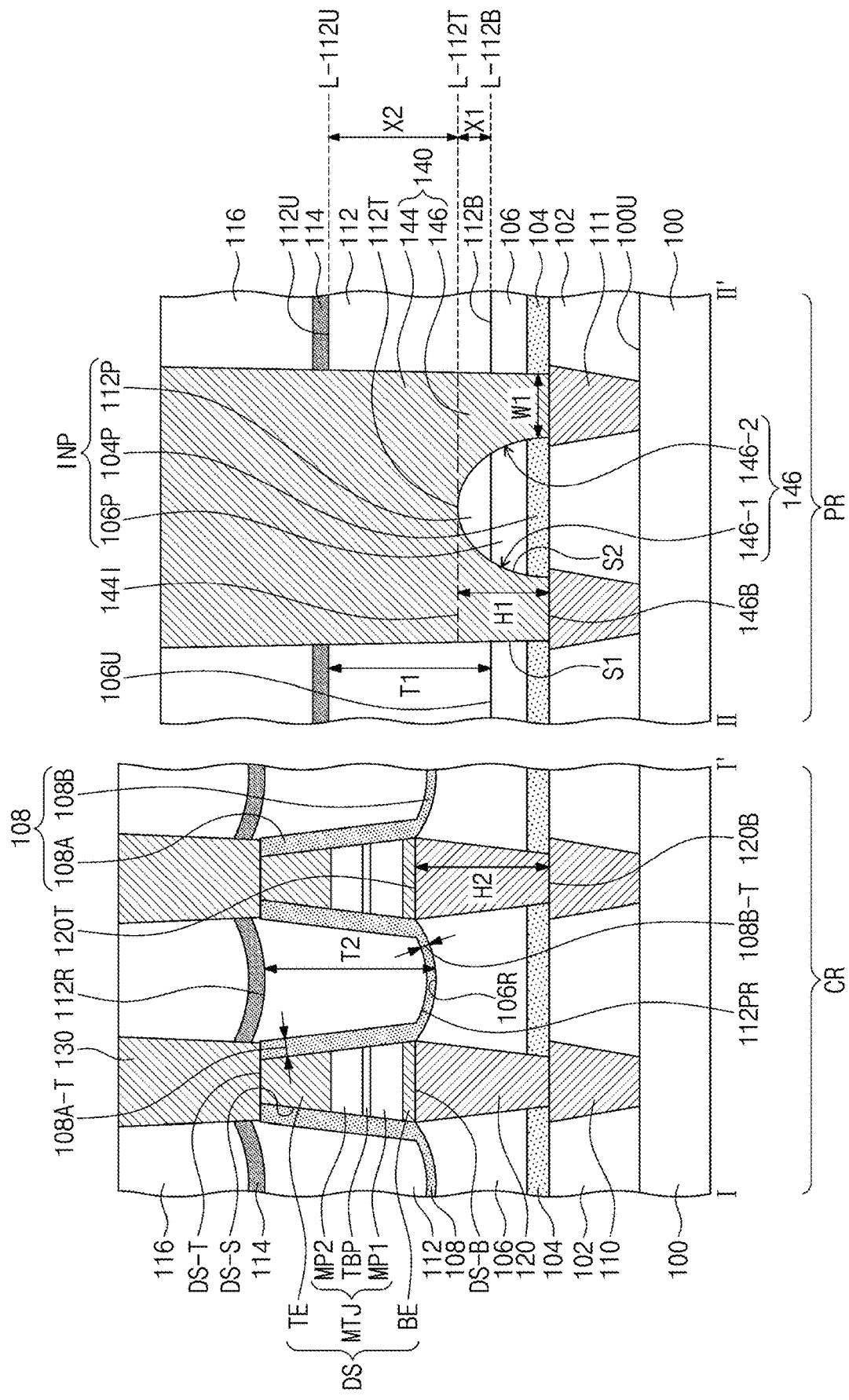
FIG. 4 is a cross-sectional view taken along lines I-I' and II-II' of FIG. 3.
Figure 5A:
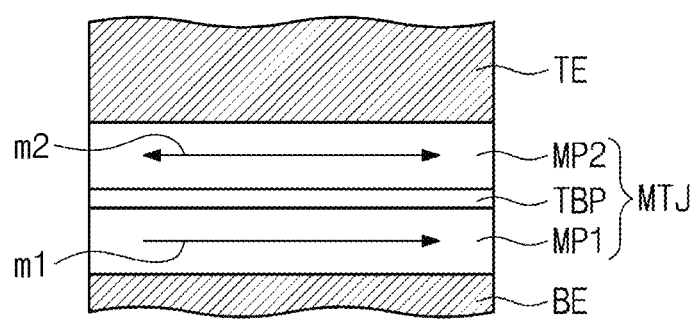
FIGS. 5A and 5B are cross-sectional views illustrating examples of a magnetic tunnel junction pattern of a magnetic memory device according to some example embodiments of the inventive concepts.
Figure 5B:
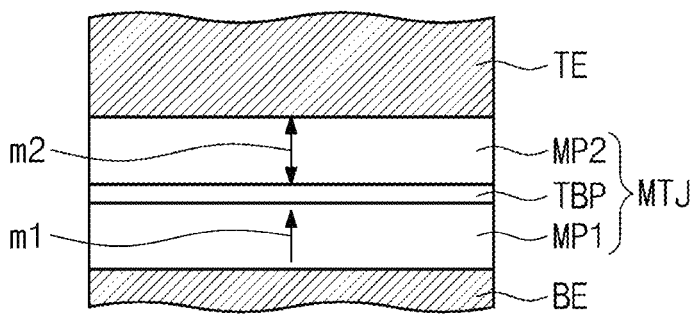

FIG. 3 is a plan view illustrating a magnetic memory device according to some example embodiments of the inventive concepts. FIG. 4 is a cross-sectional view taken along lines I-I' and II-II' of FIG. 3. FIGS. 5A and 5B are cross-sectional views illustrating examples of a magnetic tunnel junction pattern of a magnetic memory device according to some example embodiments of the inventive concepts.

Referring to FIGS. 3 and 4, a substrate 100 may include a cell region CR and a peripheral circuit region PR. The cell region CR may be a region of the substrate 100, on which memory cells are provided. The peripheral circuit region PR may be another region of the substrate 100, on which a peripheral circuit for driving the memory cells is provided.

A first lower interlayer insulating layer 106, a second lower interlayer insulating layer 102 and a first etch stop layer 104 may be provided on the substrate 100, in some example embodiments provided on the cell region CR and the peripheral circuit region PR as shown in FIG. 4. The second lower interlayer insulating layer 102 may be provided between the substrate 100 and the first lower interlayer insulating layer 106, and the first etch stop layer 104 may be disposed between the first lower interlayer insulating layer 106 and the second lower interlayer insulating layer 102, such that the first lower interlayer insulating layer 106 may be understood to be on the first etch stop layer 104.

It will be understood that an element described herein as being "on" another element may be above or beneath the other element. In addition, an element described herein as being "on" another element may be "directly on" the other element, such that the element is in direct contact with the other element, or "indirectly on" the other element, such that the element is isolated from direct contact with the other element by one or more interposing spaces and/or structures.

Each of the first lower interlayer insulating layer 106, the second lower interlayer insulating layer 102 and the first etch stop layer 104 may cover the cell region CR and the peripheral circuit region PR of the substrate 100.

The substrate 100 may be a semiconductor substrate that includes silicon (Si), silicon on an insulator (SOI), silicon-germanium (SiGe), germanium (Ge), or gallium-arsenic (GaAs). Each of the first and second lower interlayer insulating layers 106 and 102 may include an oxide, a nitride, and/or an oxynitride. Each of the first and second lower interlayer insulating layers 106 and 102 may include, for example, tetraethyl orthosilicate (TEOS). The first etch stop layer 104 may include a different material from that of the first and second lower interlayer insulating layers 106 and 102. The first etch stop layer 104 may include a material having an etch selectivity with respect to the first and second lower interlayer insulating layers 106 and 102. The first etch stop layer 104 may include a nitride (e.g., silicon-carbon nitride).

Selection elements (not shown) may be provided on the cell region CR of the substrate 100. The selection elements may be field effect transistors or diodes. The selection elements may be connected to the word line WL of FIG. 2. The second lower interlayer insulating layer 102 may cover the selection elements. First lower contact plugs 110 may be provided on the cell region CR of the substrate 100, and peripheral conductive patterns 111 may be provided on the peripheral circuit region PR of the substrate 100. The first lower contact plugs 110 and the peripheral conductive patterns 111 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide). At least one of the first lower contact plugs 110 on cell region CR may be electrically connected to the selection element (not shown) on the cell region CR.

Second lower contact plugs 120 may be provided on the cell region CR of the substrate 100. Each of the second lower contact plugs 120 may penetrate the first lower interlayer insulating layer 106 and the first etch stop layer 104 and may be connected to one terminal of a corresponding one of the selection elements through the first lower contact plug 110. The second lower contact plugs 120 may include at least one of a doped semiconductor material (e.g., doped silicon), a metal (e.g., tungsten, titanium, or tantalum), a conductive metal nitride (e.g., titanium nitride, tantalum nitride, or tungsten nitride), or a metal-semiconductor compound (e.g., a metal silicide).

Data storage structures DS may be provided on the cell region CR of the substrate 100. As shown in FIG. 4, the data storage structures DS may be on (e.g., above and directly or indirectly on) the first lower interlayer insulating layer 106 on the cell region CR. While FIGS. 3-4 illustrate multiple data storage structures DS on the cell region CR, it will be understood that in some example embodiments a magnetic memory device may include any quantity of data storage structures DS on the cell region CR, including being limited to including a single, individual data storage structure DS on the cell region CR. The data storage structures DS may be two-dimensionally arranged in a first direction D1 and a second direction D2 intersecting the first direction D1 when viewed in a plan view. The data storage structures DS may be provided on (e.g., above and directly or indirectly on) the first lower interlayer insulating layer 106 of the cell region CR and may be connected to (e.g., in direct contact with) separate, respective second lower contact plugs 120. Accordingly, as shown in FIG. 4, the data storage structures DS may be on (e.g., indirectly on) separate, respective first lower contact plugs 110 and thus may be understood to be on the first lower contact plugs 110, and the data storage structures DS may be on (e.g., directly on) separate, respective second lower contact plugs 120 and thus may be understood to be on the second lower contact plugs 120. It will be further understood that the first lower interlayer insulating layer 106 (which may be absent in some example embodiments) may be beneath (e.g., under) the bottom surfaces DS-B of the data storage structures DS such that a top surface 106R of the first lower interlayer insulation layer 106 on the cell region CR is proximate to the top surface 100U of the substrate 100 in relation to the bottom surfaces DS-B of the data storage structures DS. Each of the data storage structures DS may include a magnetic tunnel junction pattern MTJ, a bottom electrode BE between the magnetic tunnel junction pattern MTJ and each of the second lower contact plugs 120, and a top electrode TE spaced apart from the bottom electrode BE with the magnetic tunnel junction pattern MTJ interposed therebetween. The magnetic tunnel junction pattern MTJ may be provided between the bottom electrode BE and the top electrode TE. The bottom electrode BE may be in contact with each of the second lower contact plugs 120. For example, the bottom electrode BE may include a conductive metal nitride (e.g., titanium nitride or tantalum nitride). For example, the top electrode TE may include at least one of a metal (e.g., Ta, W, Ru, or Ir) or a conductive metal nitride (e.g., TiN). As described herein, elements that are "in contact" with each other will be understood to be "in direct contact" with each other or "directly contacting" each other.

It will be understood that the first direction D1 and/or a direction parallel to a top surface 100U of the substrate 100 may be referred to interchangeably as a horizontal direction, such that a horizontal distance may be understood to be a distance in the horizontal direction that is parallel to the top surface 100U. It will be understood that a direction perpendicular to the top surface 100U of the substrate 100 may be referred to interchangeably as a vertical direction, such that a vertical distance may be understood to be a distance in the vertical direction that is perpendicular to the top surface 100U.

The magnetic tunnel junction pattern MTJ may include a first magnetic pattern MP1, a second magnetic pattern MP2, and a tunnel barrier pattern TBP disposed between the first and second magnetic patterns MP1 and MP2. The first magnetic pattern MP1 may be provided between the bottom electrode BE and the tunnel barrier pattern TBP, and the second magnetic pattern MP2 may be provided between the top electrode TE and the tunnel barrier pattern TBP. For example, the tunnel barrier pattern TBP may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the first and second magnetic patterns MP1 and MP2 may include at least one magnetic layer.

Referring to FIGS. 5A and 5B, the first magnetic pattern MP1 may include a reference layer having a magnetization direction m1 fixed in one direction, and the second magnetic pattern MP2 may include a free layer having a magnetization direction m2 changeable to be parallel or anti-parallel to the magnetization direction m1 of the reference layer. FIGS. 5A and 5B illustrate the examples in which the first magnetic pattern MP1 includes the reference layer and the second magnetic pattern MP2 includes the free layer. However, embodiments of the inventive concepts are not limited thereto. Unlike FIGS. 5A and 5B, the first magnetic pattern MP1 may include the free layer and the second magnetic pattern MP2 may include the reference layer.

In some example embodiments, as illustrated in FIG. 5A, the magnetization directions m1 and m2 may be substantially parallel (e.g., parallel within manufacturing tolerances and/or material tolerances) to an interface between the tunnel barrier pattern TBP and the first magnetic pattern MP1. In this case, each of the reference layer and the free layer may include a ferromagnetic material. The reference layer may further include an anti-ferromagnetic material for fixing or pinning a magnetization direction of the ferromagnetic material. It will be understood that elements and/or directions described to be parallel to a reference element may be parallel or substantially parallel with the reference element (e.g., parallel within manufacturing tolerances and/or material tolerances). It will be understood that elements and/or directions described to be perpendicular to a reference element may be perpendicular or substantially perpendicular with the reference element (e.g., perpendicular within manufacturing tolerances and/or material tolerances).

In some example embodiments, as illustrated in FIG. 5B, the magnetization directions m1 and m2 may be substantially perpendicular to the interface between the tunnel barrier pattern TBP and the first magnetic pattern MP1. In this case, each of the reference layer and the free layer may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. Here, the reference layer may be thicker than the free layer, and/or a coercive force of the reference layer may be greater than a coercive force of the free layer.

Referring again to FIGS. 3 and 4, the first lower interlayer insulating layer 106 on the cell region CR may have a recessed top surface 106R that is recessed toward the substrate 100 between adjacent data storage structures DS. A level of the recessed top surface 106R of the first lower interlayer insulating layer 106 on the cell region CR may be higher than a level of a top surface 106U of the first lower interlayer insulating layer 106 on the peripheral circuit region PR.

A protective insulating layer 108 may be provided. In some example embodiments, the protective insulating layer 108 may be absent. The protective insulating layer 108 may include a first portion 108A provided on a sidewall of each of the data storage structures DS, and a second portion 108B provided on the recessed top surface 106R of the first lower interlayer insulating layer 106. Accordingly, it will be understood that the protective insulating layer 108 extends onto the recessed top surface 106R of the first lower interlayer insulating layer 106.

The first portion 108A of the protective insulating layer 108 may surround the sidewall DS-S of each of the data storage structures DS when viewed in a plan view. The first portion 108A may cover sidewalls of the bottom electrode BE, the magnetic tunnel junction pattern MTJ and the top electrode TE, where said sidewalls collectively define the sidewall DS-S of a data structure DS, and covering said sidewalls may include directly contacting said sidewalls, and may surround the sidewalls of the bottom electrode BE, the magnetic tunnel junction pattern MTJ and the top electrode TE when viewed in a plan view. As shown, the protective insulating layer 108 may cover and/or surround a sidewall DS-S of each of the data storage structures DS on the cell region CR and may expose (e.g., not cover) a top surface DS-T of each of the data storage structures DS on the cell region CR, where said top surface DS-T may be a top surface of the top electrode TE.

A thickness of the first portion 108A of the protective insulating layer 108 may be greater than a thickness of the second portion 108B of the protective insulating layer 108. Restated, a thickness 108A-T of the protective insulating layer 108 on the sidewall DS-S of each of the data storage structures DS may be greater than a thickness 108B-T of the protective insulating layer 108 on the recessed top surface 106R of the first lower interlayer insulating layer 106, where the thickness of a given portion of the protective insulating layer 108 (e.g., 108A-T, 108B-T) may be measured in a direction that is normal to the surface (e.g., DS-S, 106R) on which the given portion of the protective insulating layer 108 is located. In some example embodiments, the thickness 108A-T of the first portion 108A of the protective insulating layer 108 may be measured in a horizontal direction extending parallel to the top surface 100U of the substrate 100 and the thickness 108B-T of the second portion 108B of the protective insulating layer 108 may be measured in a vertical direction extending perpendicular to the top surface 100U of the substrate 100. The protective insulating layer 108 may not be provided on the top surface 106U of the first lower interlayer insulating layer 106 on the peripheral circuit region PR. Restated, in some example embodiments, the protective insulating layer 108 may not be on the peripheral circuit region PR. In some example embodiments, the protective insulating layer 108 may extend onto the top surface 106U of the first lower interlayer insulating layer 106 on the peripheral circuit region PR, and a thickness of the extending portion of the protective insulating layer 108 may be equal to or less than the thickness of the second portion 108B of the protective insulating layer 108.

A first upper interlayer insulating layer 112 may be provided on (e.g., above and directly or indirectly on) the first lower interlayer insulating layer 106 and may cover the cell region CR and the peripheral circuit region PR of the substrate 100. The first upper interlayer insulating layer 112 may be provided on the first lower interlayer insulating layer 106 on the cell region CR to cover the data storage structures DS and may cover the first lower interlayer insulating layer 106 on the peripheral circuit region PR. The protective insulating layer 108 may be disposed between the first upper interlayer insulating layer 112 and the sidewall DS-S of each of the data storage structures DS and between the first upper interlayer insulating layer 112 and the recessed top surface 106R of the first lower interlayer insulating layer 106 on the cell region CR. In some example embodiments, the first upper interlayer insulating layer 112 may be partially or entirely indirectly on the first lower interlayer insulating layer 106 in the cell region CR and may be partially or entirely directly on the first lower interlayer insulating layer 106 in the peripheral circuit region. Accordingly, the protective insulating layer 108 may be between the first lower interlayer insulating layer 106 and the first upper interlayer insulating layer 112 in at least the cell region CR. Furthermore, as shown in FIG. 4, the magnetic memory device may include a sequential stack of the first lower interlayer insulating layer 106, the protective insulating layer 108, and the first upper interlayer insulating layer 112 on the substrate 100.

The first upper interlayer insulating layer 112 may include at least one of an oxide, a nitride, or an oxynitride. The protective insulating layer 108 may include a different material from those of the first upper interlayer insulating layer 112 and the first lower interlayer insulating layer 106. For example, the protective insulating layer 108 may include a different total material composition from both a total material composition of the first upper interlayer insulating layer 112 and a total material composition of the first lower interlayer insulating layer 106. The protective insulating layer 108 may include a material having an etch selectivity with respect to the first upper interlayer insulating layer 112 and the first lower interlayer insulating layer 106. The protective insulating layer 108 may include a nitride (e.g., silicon nitride). As shown in FIG. 4, in some example embodiments, the top surface 106U of the first lower interlayer insulating layer 106 on the peripheral circuit region PR and a bottom surface 112B of the first upper interlayer insulating layer on the peripheral circuit region PR may be in contact with each other. In some example embodiments, the first lower interlayer insulating layer 106 and the first upper interlayer insulating layer may include a same material (e.g., a same material may be included in their respective total material compositions). In some example embodiments, the first lower interlayer insulating layer 106 and the first upper interlayer insulating layer may have a same total material composition.

As shown in FIG. 4, at least a portion of the first upper interlayer insulating layer 112 on the cell region CR may include a recessed top surface 112R that is recessed in height, e.g., a height in a vertical direction that is perpendicular to the top surface 100U of the substrate 100, from the substrate 100 between adjacent data storage structures DS and a protruding bottom surface 112PR that protrudes towards the substrate 100 between adjacent data storage structures DS. A distance T1, e.g., a vertical distance in the vertical direction that is perpendicular to the top surface 100U of the substrate, between the top surface 106U of the first lower interlayer insulating layer 106 and a top surface 112U of the first upper interlayer insulating layer 112 on the peripheral circuit region PR, where such distance T1 may be understood to be a thickness of the first upper interlayer insulating layer 112 on the peripheral circuit region PR, may be less than a maximum value of a distance T2, e.g., a vertical distance in the vertical direction that is perpendicular to the top surface 100U of the substrate, between the recessed top surface 106R of the first lower interlayer insulating layer 106 and a recessed top surface 112R of the first upper interlayer insulating layer 112 vertically adjacent thereto on the cell region CR. In some example embodiments, the distance T1 between the top surface 106U of the first lower interlayer insulating layer 106 and a top surface 112U of the first upper interlayer insulating layer 112 on the peripheral circuit region PR may be less than some or all values of the distance T2 between the recessed top surface 106R of the first lower interlayer insulating layer 106 and a recessed top surface 112R of the first upper interlayer insulating layer 112 vertically adjacent thereto on the cell region CR. This may be because the protective insulating layer 108 is disposed between the first lower interlayer insulating layer 106 and the first upper interlayer insulating layer 112 on the cell region CR but the protective insulating layer 108 is not disposed between the first lower interlayer insulating layer 106 and the first upper interlayer insulating layer 112 on the peripheral circuit region PR. When the protective insulating layer 108 remains on the peripheral circuit region PR, the distance T1 between the top surface 106U of the first lower interlayer insulating layer 106 and a top surface 112U of the first upper interlayer insulating layer 112 on the peripheral circuit region PR may be substantially equal to the maximum value T2 of the distance between the recessed top surface 106R of the first lower interlayer insulating layer 106 and the recessed top surface 112R of the first upper interlayer insulating layer 112 vertically adjacent thereto on the cell region CR.

A second upper interlayer insulating layer 116 may be provided on the first upper interlayer insulating layer 112, and a second etch stop layer 114 may be disposed between the first upper interlayer insulating layer 112 and the second upper interlayer insulating layer 116. Each of the second etch stop layer 114 and the second upper interlayer insulating layer 116 may cover the cell region CR and the peripheral circuit region PR of the substrate 100. The second upper interlayer insulating layer 116 may include at least one of an oxide, a nitride, or an oxynitride. The second etch stop layer 114 may include a different material from that of the first and second upper interlayer insulating layers 112 and 116. The second etch stop layer 114 may include a material having an etch selectivity with respect to the first and second upper interlayer insulating layers 112 and 116. The second etch stop layer 114 may include a nitride (e.g., silicon nitride). In some example embodiments, the second etch stop layer 114 may include the same material, e.g., may have the same total material composition, as the protective insulating layer 108 or the first etch stop layer 104.

Cell interconnection structures 130 may be provided on the cell region CR of the substrate 100. Each of the cell interconnection structures 130 may penetrate the second upper interlayer insulating layer 116 and the second etch stop layer 114 so as to be connected to corresponding ones of the data storage structures DS. Each of the cell interconnection structures 130 may be connected in common to the data storage structures DS arranged in the first direction D1. The cell interconnection structures 130 may include a metal (e.g., copper). Top surfaces of the cell interconnection structures 130 may be substantially coplanar with a top surface of the second upper interlayer insulating layer 116. The cell interconnection structure 130 may correspond to the bit line BL of FIG. 2.

A peripheral interconnection structure 140 on the peripheral circuit region PR of the substrate 100 may penetrate the second upper interlayer insulating layer 116, the second etch stop layer 114, the first upper interlayer insulating layer 112, the first lower interlayer insulating layer 106, and the first etch stop layer 104 on the peripheral circuit region PR so as to be connected to the peripheral conductive patterns 111.

The peripheral interconnection structure 140 may include a line portion 144 extending in a direction (e.g., the first direction D1) parallel to a top surface 100U of the substrate 100, and contact portions 146 extending from the line portion 144 toward the substrate 100. The contact portions 146 shown in FIGS. 3-4, also referred to herein as a first contact portion 146-1 and a second contact portion 146-2, may be horizontally spaced apart from each other, e.g., spaced apart from each other in a horizontal direction that is parallel to the top surface 100U of the substrate 100, by an insulating pattern INP interposed therebetween. For example, at least the respective bottom surfaces 146B of the first and second contact portions 146-1, 146-2 may be isolated from direct contact with each other in a horizontal direction extending parallel to the top surface 100U of the substrate 100. In another example, the first and second contact portions 146-1, 146-2 may be completely isolated from direct contact with each other in a horizontal direction extending parallel to the top surface 100U of the substrate 100. The contact portions 146 may be connected to the peripheral conductive patterns 111, respectively, and the line portion 144 may be connected in common to the contact portions 146 at interface 144I. In some example embodiments, line portion 144 and the contact portions 146 may be formed in one body (e.g., may be part of a single, uniform piece of material) without an interface therebetween, such that interface 144I may not be a physical interface between separate pieces of material.

The line portion 144 may penetrate the second upper interlayer insulating layer 116, the second etch stop layer 114, and an upper portion of the first upper interlayer insulating layer 112 on the peripheral circuit region PR. Each of the contact portions 146 may penetrate a lower portion of the first upper interlayer insulating layer 112 and the first lower interlayer insulating layer 106 on the peripheral circuit region PR. The insulating pattern INP may include some or all of a first upper interlayer insulating pattern 112P, which is a portion of the first upper interlayer insulating layer 112, a first lower interlayer insulating pattern 106P, which is a portion of the first lower interlayer insulating layer 106, and a first etch stop pattern 104P, which is a portion of the first etch stop layer 104.

The first upper interlayer insulating pattern 112P, the first lower interlayer insulating pattern 106P and the first etch stop pattern 104P may respectively correspond to a portion of the first upper interlayer insulating layer 112, a portion of the first lower interlayer insulating layer 106 and a portion of the first etch stop layer 104, which remain after an etching process to be described later.

A level L-112T of the top 112T of the insulating pattern INP, which as shown in FIG. 4 may be a top of the first upper interlayer insulating pattern 112 that at least partially comprises the insulating pattern INP, may be located in the first upper interlayer insulating layer 112 on the peripheral circuit region PR. As shown in FIG. 4, the level L-112T of the top 112T of the insulating pattern INP, e.g., the vertical distance of the top 112T from the top surface 100U of the substrate 100, may be closer to a level L-112B of the bottom surface 112B of the first upper interlayer insulating layer 112 adjacent to the peripheral interconnection structure 140, e.g., a vertical distance of the bottom surface 112B of the first upper interlayer insulating layer 112 adjacent to the peripheral interconnection structure 140 from top surface 100U, than to a level L-112T of the top surface 112U of the first upper interlayer insulating layer 112 adjacent to the peripheral interconnection structure 140, e.g., a vertical distance of the top surface 112U of the first upper interlayer insulating layer 112 adjacent to the peripheral interconnection structure 140 from top surface 100U. Restated, as shown in FIG. 4, the vertical distance X1 between level L-112T and level L-112B may be less than the vertical distance X2 between level L-112T and level L-112U. The level of the top 112T of the insulating pattern INP may correspond to a level of the top of the contact portion 146.

Each of the contact portions 146, e.g., each contact portion 146 of the contact portions 146, may have a width W1 in the first direction D1 parallel to the top surface 100U of the substrate 100. As shown in FIG. 4, a width W1, e.g., a width in the horizontal direction, of each contact portion 146 of the contact portions 146 may increase as a vertical distance of the contact portion 146 from the top surface 100U of the substrate 100 increases.

Each of the contact portions 146 may have a first sidewall S1 and a second sidewall S2 opposite to the first sidewall S1 when viewed in a cross-sectional view.

A gradient of the second sidewall S2 may gradually decrease along a third direction away from the top surface 100U of the substrate 100. Restated, and as shown in FIG. 4, a gradient of the second sidewall S2 of a given contact portion 146, e.g., the first contact portion 146-1, may decrease as a vertical distance of the given contact portion 146 from the top surface 100U of the substrate 100 increases. For example, as shown in FIGS. 3-4, the second sidewall S2 may have a rounded shape. As shown in FIG. 4, an average gradient of the second sidewall S2 of a contact portion 146, e.g., the first contact portion 146-1, may be less than an average gradient of the first sidewall of the same contact portion 146, e.g., the first contact portion 146-1.

An aspect ratio of each of the contact portions 146 may be 1.5:1 or less. The aspect ratio of the contact portion 146 may correspond to a ratio of a height H1, of the contact portion 146 to a width, e.g., W1, of a bottom surface 146B of the contact portion 146. As shown, the height H1 of a contact portion 146 may be a vertical distance from a bottom surface 146B of the contact portion 146 to an interface 144I between the contact portion 146 and the line portion 144. Accordingly, in some example embodiments, a ratio of the height H1 of each contact portion of the contact portions 146 to a width W1 of a bottom surface 146B of the contact portion 146 of the contact portions 146 may be equal to or less than 1.5:1. The height H1 of the contact portion 146 may correspond to a thickness of the insulating pattern INP. The height H1 of the contact portion 146, e.g., the height H1 in the vertical direction of each of the contact portions 146, may be less than a height H2 of the second lower contact plug 120 of the cell region CR, e.g., may be less than a height H2 in the vertical direction of each of the second lower contact plugs 120. Accordingly, in some example embodiments, a height H1 of each of the contact portions 146 may be less than a height H2 of each of the second lower contact plugs 120. As shown in FIG. 4, height H2 may be understood to be a vertical distance from a bottom surface 120B of the second lower contact plug 120 to a top surface 120T of the second lower contact plug 120.

As shown in FIG. 4, the second sidewalls S2 of the first and second contact portions 146-1, 146-2 may be opposing sidewalls. For example, the second sidewalls S2 of the first and second contact portions 146-1, 146-2 may face each other in a horizontal direction that is parallel to the top surface 100U of the substrate 100. Thus, it will be understood that the second sidewall S2 of the first contact portion 146-1 may be proximate to the second contact portion 146-2 in relation to the first sidewall S1 of the first contact portion 146-1. The second sidewalls S2 of two contact portions 146 adjacent to each other, e.g., opposing sidewalls of adjacent contact portions 146, may be joined to each other to constitute an arch shape. In other words, a sidewall and a top surface of the insulating pattern INP may constitute an arch shape.

A top surface of the peripheral interconnection structure 140 (i.e., a top surface of the line portion 144) may be substantially coplanar with a top surface of the second upper interlayer insulating layer 116 of the peripheral circuit region PR. The line portion 144 and the contact portions 146 may include the same material as the cell interconnection structure 130. The line portion 144 and the contact portions 146 may include a metal (e.g., copper).

It will be understood that, in some example embodiments, a magnetic memory device may omit one or more of the elements shown in the example embodiments illustrated in at least FIGS. 3-4.

FIGS. 6, 7, 8, 9, 10, 11, 12, and 13 are cross-sectional views corresponding to the lines I-I' and II-II' of FIG. 3 to illustrate a method for manufacturing a magnetic memory device according to some example embodiments of the inventive concepts. Hereinafter, the descriptions to the same technical features as mentioned with reference to FIGS. 3, 4, 5A and 5B will be omitted or mentioned briefly for the purpose of ease and convenience in explanation.

Figure 6:
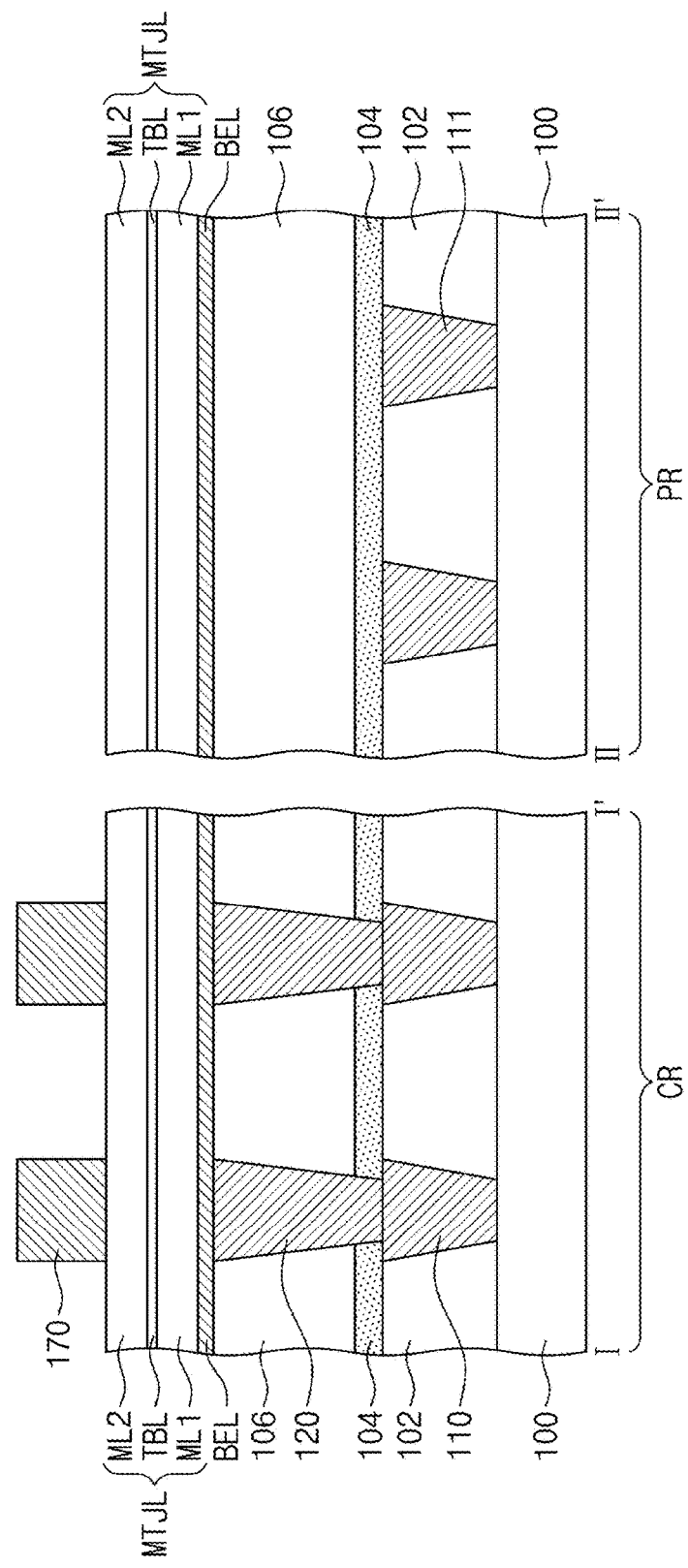
FIGS. 6, 7, 8, 9, 10, 11, 12, and 13 are cross-sectional views corresponding to the lines I-I' and II-II' of FIG. 3 to illustrate a method for manufacturing a magnetic memory device according to some example embodiments of the inventive concepts.

Referring to FIG. 6, a substrate 100 may be provided. The substrate 100 may include a cell region CR and a peripheral circuit region PR. Selection elements (not shown) may be formed on the cell region CR of the substrate 100.

A second lower interlayer insulating layer 102 may be formed on the substrate 100 to cover the cell region CR and the peripheral circuit region PR. The second lower interlayer insulating layer 102 may cover the selection elements.

First lower contact plugs 110 and peripheral conductive patterns 111 may be formed on the cell region CR and the peripheral circuit region PR of the substrate 100, respectively. Top surfaces of the first lower contact plugs 110 and top surfaces of the peripheral conductive patterns 111 may be substantially coplanar with a top surface of the second lower interlayer insulating layer 102.

A first etch stop layer 104 and a first lower interlayer insulating layer 106 may be formed on the cell region CR and the peripheral circuit region PR of the substrate 100. The first etch stop layer 104 and the first lower interlayer insulating layer 106 may be sequentially formed on the second lower interlayer insulating layer 102 and may cover the top surfaces of the first lower contact plugs 110 and the peripheral conductive patterns 111.

Second lower contact plugs 120 may be formed on the cell region CR of the substrate 100. Each of the second lower contact plugs 120 may penetrate the first lower interlayer insulating layer 106 and the first etch stop layer 104 so as to be connected to the first lower contact plug 110 and may be connected to one terminal of a corresponding one of the selection elements through the first lower contact plug 110.

A bottom electrode layer BEL and a magnetic tunnel junction layer MTJL may be sequentially formed on the first lower interlayer insulating layer 106. Each of the bottom electrode layer BEL and the magnetic tunnel junction layer MTJL may be formed to cover the cell region CR and the peripheral circuit region PR of the substrate 100. For example, the bottom electrode layer BEL may include a conductive metal nitride (e.g., titanium nitride or tantalum nitride). The bottom electrode layer BEL may be formed by a sputtering process, a chemical vapor deposition (CVD) process, or an atomic layer deposition (ALD) process. The magnetic tunnel junction layer MTJL may include a first magnetic layer ML1, a tunnel barrier layer TBL, and a second magnetic layer ML2, which are sequentially stacked on the bottom electrode layer BEL. Each of the first and second magnetic layers ML1 and ML2 may include at least one magnetic layer. One of the first and second magnetic layers ML1 and ML2 may include a reference layer having a magnetization direction fixed in one direction, and the other of the first and second magnetic layers ML1 and ML2 may include a free layer having a changeable magnetization direction. Materials of the reference layer and the free layer may be the same as described with reference to FIGS. 5A and 5B. For example, the tunnel barrier layer TBL may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. Each of the first magnetic layer ML1, the tunnel barrier layer TBL and the second magnetic layer ML2 may be formed by a sputtering process, a CVD process, or an ALD process.

Conductive mask patterns 170 may be formed on the magnetic tunnel junction layer MTJL provided on the cell region CR. The conductive mask patterns 170 may define regions in which magnetic tunnel junction patterns will be formed. For example, the conductive mask patterns 170 may include at least one of a metal (e.g., Ta, W, Ru, or Ir) or a conductive metal nitride (e.g., TiN).

Figure 7:
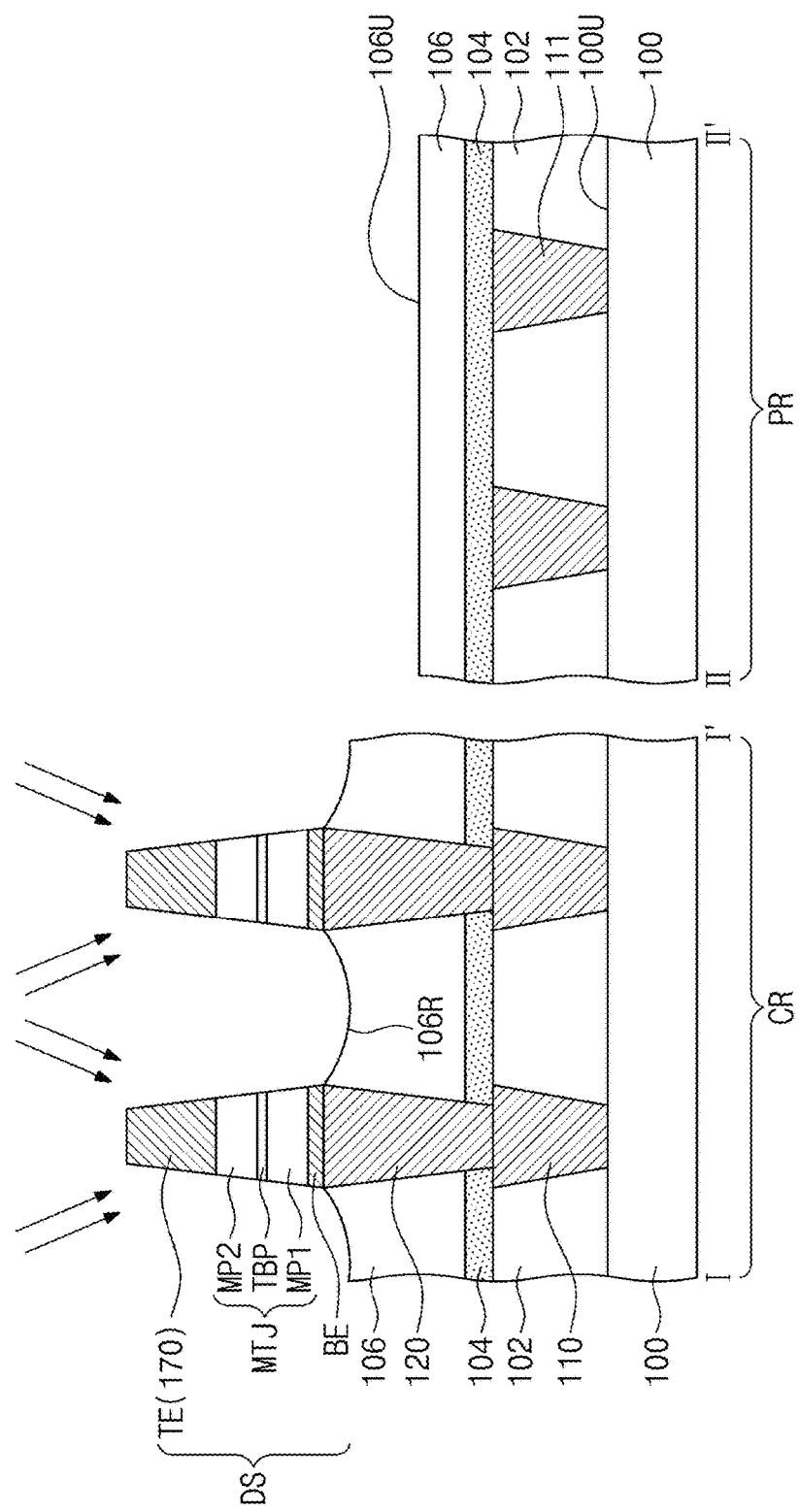

Referring to FIG. 7, the magnetic tunnel junction layer MTJL and the bottom electrode layer BEL may be sequentially etched using the conductive mask patterns 170 as etch masks. Thus, magnetic tunnel junction patterns MTJ and bottom electrodes BE may be formed on the first lower interlayer insulating layer 106 of the cell region CR. The etching of the magnetic tunnel junction layer MTJL may include sequentially etching the second magnetic layer ML2, the tunnel barrier layer TBL and the first magnetic layer ML1 by using the conductive mask patterns 170 as etch masks. The second magnetic layer ML2, the tunnel barrier layer TBL and the first magnetic layer ML1 may be etched to form a second magnetic pattern MP2, a tunnel barrier pattern TBP and a first magnetic pattern MP1, respectively.

The etching process of etching the magnetic tunnel junction layer MTJL and the bottom electrode layer BEL may be, for example, an ion beam etching process using an ion beam. The ion beam may include ions of an inert gas. An upper portion of the first lower interlayer insulating layer 106 between the magnetic tunnel junction patterns MTJ may be recessed by the etching process. Thus, the first lower interlayer insulating layer 106 on the cell region CR may have a top surface 106R recessed toward the substrate 100 between the magnetic tunnel junction patterns MTJ. The recessed top surface 106R may be located at a higher level than a top surface 106U of the first lower interlayer insulating layer 106 on the peripheral circuit region PR. In other words, the top surface 106U of the first lower interlayer insulating layer 106 on the peripheral circuit region PR may be located at a lower level than the recessed top surface 106R of the first lower interlayer insulating layer 106 on the cell region CR. This may be due to a shadowing effect by the magnetic tunnel junction patterns MTJ formed on the cell region CR. Thus, in the ion beam etching process, the first lower interlayer insulating layer 106 on the peripheral circuit region PR may be removed more than the first lower interlayer insulating layer 106 on the cell region CR.

After the etching process, at least a portion of each of the conductive mask patterns 170 may remain on each of the magnetic tunnel junction patterns MTJ. The remaining conductive mask patterns 170 may function as top electrodes TE, respectively. Hereinafter, the remaining conductive mask patterns 170 are referred to as top electrodes TE. The bottom electrode BE, the magnetic tunnel junction pattern MTJ and the top electrode TE, which are sequentially stacked, may constitute a data storage structure DS.

Figure 8:
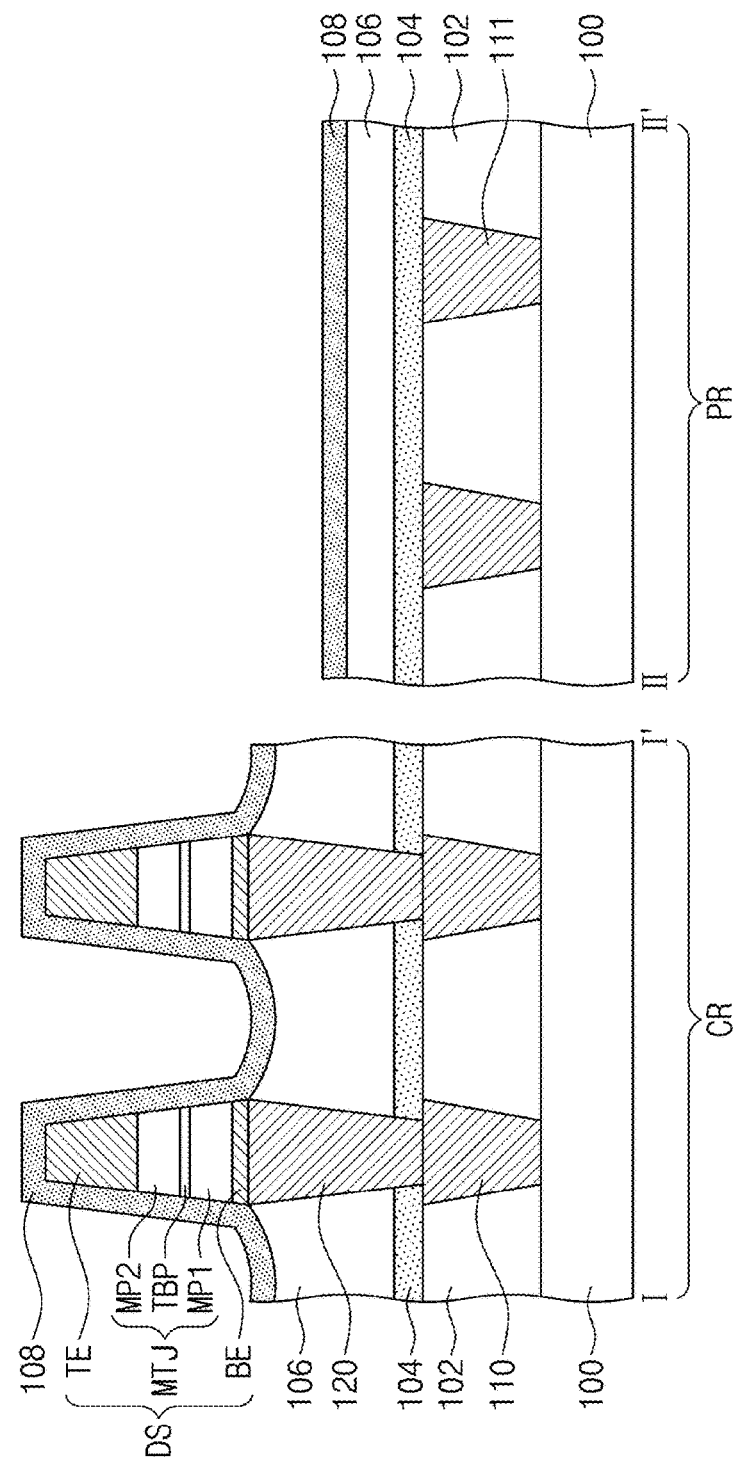

Referring to FIG. 8, a protective insulating layer 108 may be formed on the first lower interlayer insulating layer 106 to cover a plurality of the data storage structures DS. The protective insulating layer 108 may conformally cover top surfaces and sidewalls of the data storage structures DS and may extend along the recessed top surface 106R of the first lower interlayer insulating layer 106 between the data storage structures DS. The protective insulating layer 108 may extend along the top surface 106U of the first lower interlayer insulating layer 106 on the peripheral circuit region PR.

Figure 9:
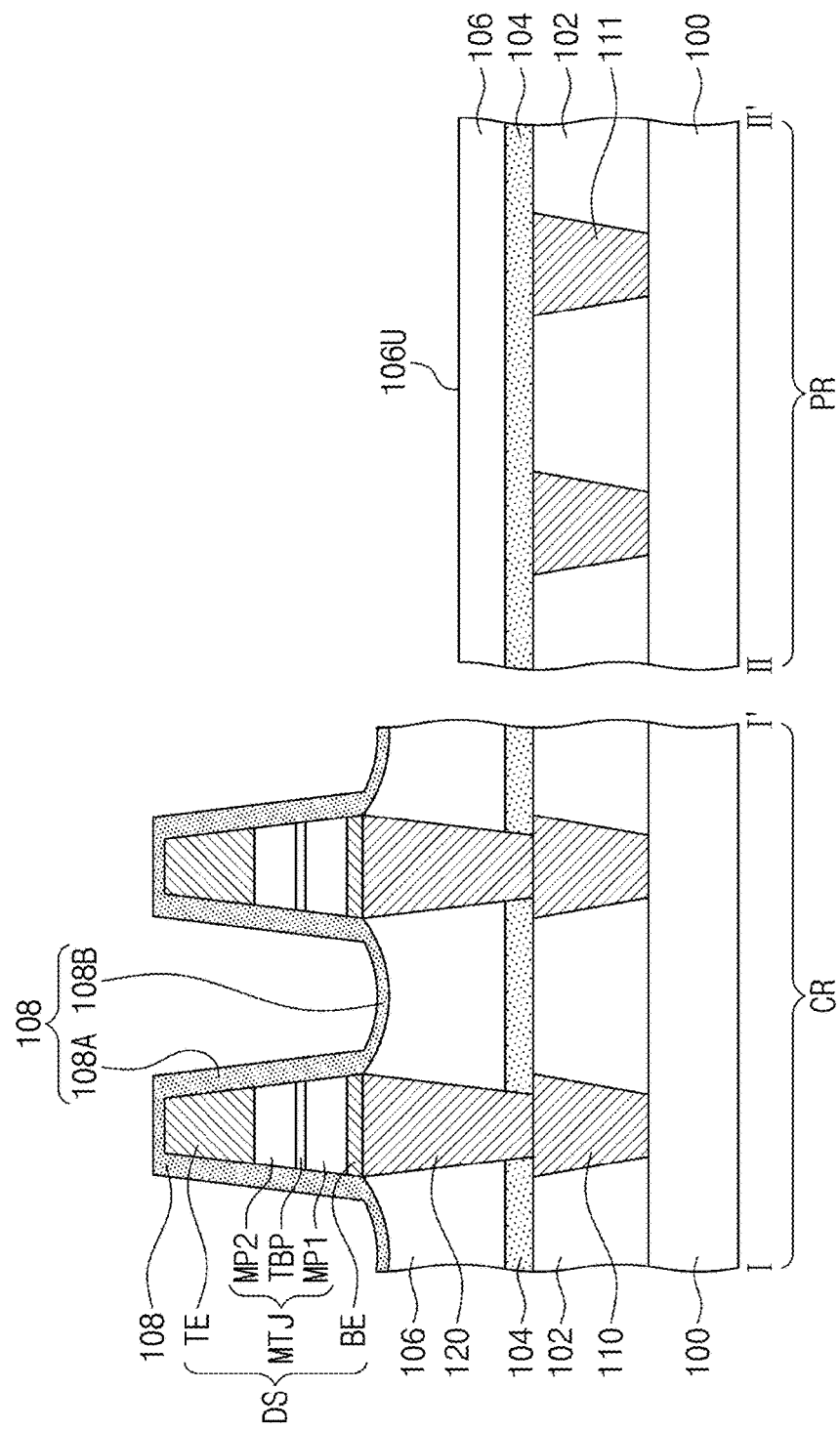

Referring to FIG. 9, the protective insulating layer 108 on the peripheral circuit region PR may be selectively removed. The process of removing the protective insulating layer 108 on the peripheral circuit region PR may include an etch-back process performed on the protective insulating layer 108 provided on the cell region CR and the peripheral circuit region PR. The etch-back process may be performed without an additional mask pattern.

The top surface 106U of the first lower interlayer insulating layer 106 on the peripheral circuit region PR may be exposed by the removal of the protective insulating layer 108 on the peripheral circuit region PR. On the contrary, the recessed top surface of the first lower interlayer insulating layer 106 on the cell region CR may be covered by a remaining protective insulating layer 108. In some example embodiments, the protective insulating layer 108 on the peripheral circuit region PR may not be completely removed but may partially remain.

By the etch-back process, a thickness of a first portion 108A of protective insulating layer 108 covering a sidewall of the data storage structure DS on the cell region CR may be greater than a thickness of a second portion 108B of protective insulating layer 108 covering a top surface of the data storage structure DS and the recessed top surface 106U of the first lower interlayer insulating layer 106.

Figure 10:
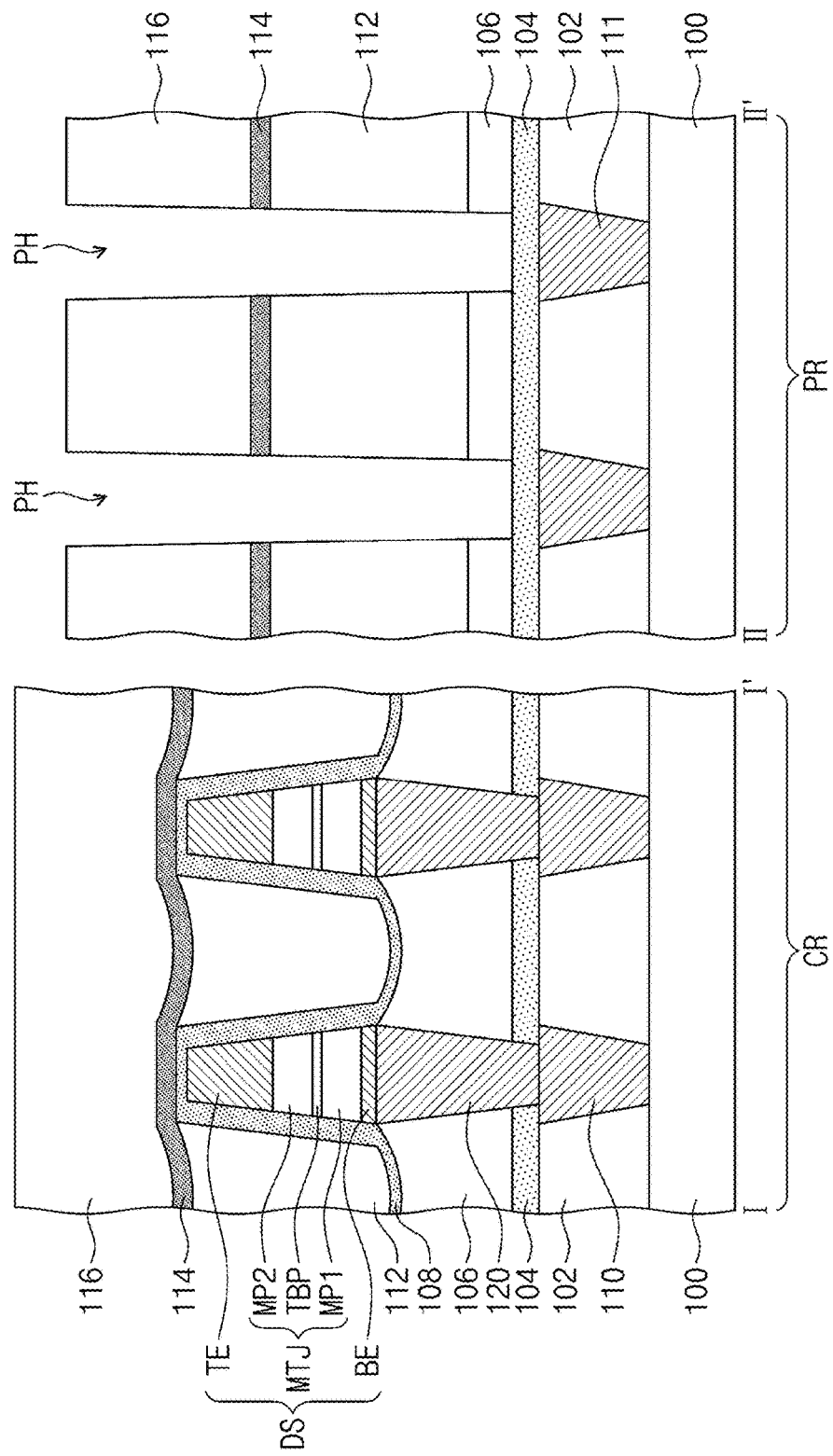

Referring to FIG. 10, a first upper interlayer insulating layer 112 may be formed on the protective insulating layer 108 to fill a space between the plurality of data storage structures DS. The first upper interlayer insulating layer 112 may cover the first lower interlayer insulating layer 106 on the peripheral circuit region PR. A second etch stop layer 114 and a second upper interlayer insulating layer 116 may be sequentially formed on the first upper interlayer insulating layer 112.

Each of the first and second lower interlayer insulating layers 106 and 102, the first and second upper interlayer insulating layers 112 and 116, the first and second etch stop layers 104 and 114 and the protective insulating layer 108 may be formed by a CVD process, a physical vapor deposition (PVD) process, or an ALD process.

Preliminary holes PH may be formed on the peripheral circuit region PR of the substrate 100. Each of the preliminary holes PH may penetrate the second upper interlayer insulating layer 116, the second etch stop layer 114, the first upper interlayer insulating layer 112, and the first lower interlayer insulating layer 106 to expose a top surface of the first etch stop layer 104. The formation of the preliminary holes PH may include forming a mask pattern (not shown) having openings defining the preliminary holes PH on the second upper interlayer insulating layer 116, and sequentially etching the second upper interlayer insulating layer 116, the second etch stop layer 114, the first upper interlayer insulating layer 112, and the first lower interlayer insulating layer 106 by using the mask pattern as an etch mask. Thereafter, the mask pattern may be removed.

Figure 11:
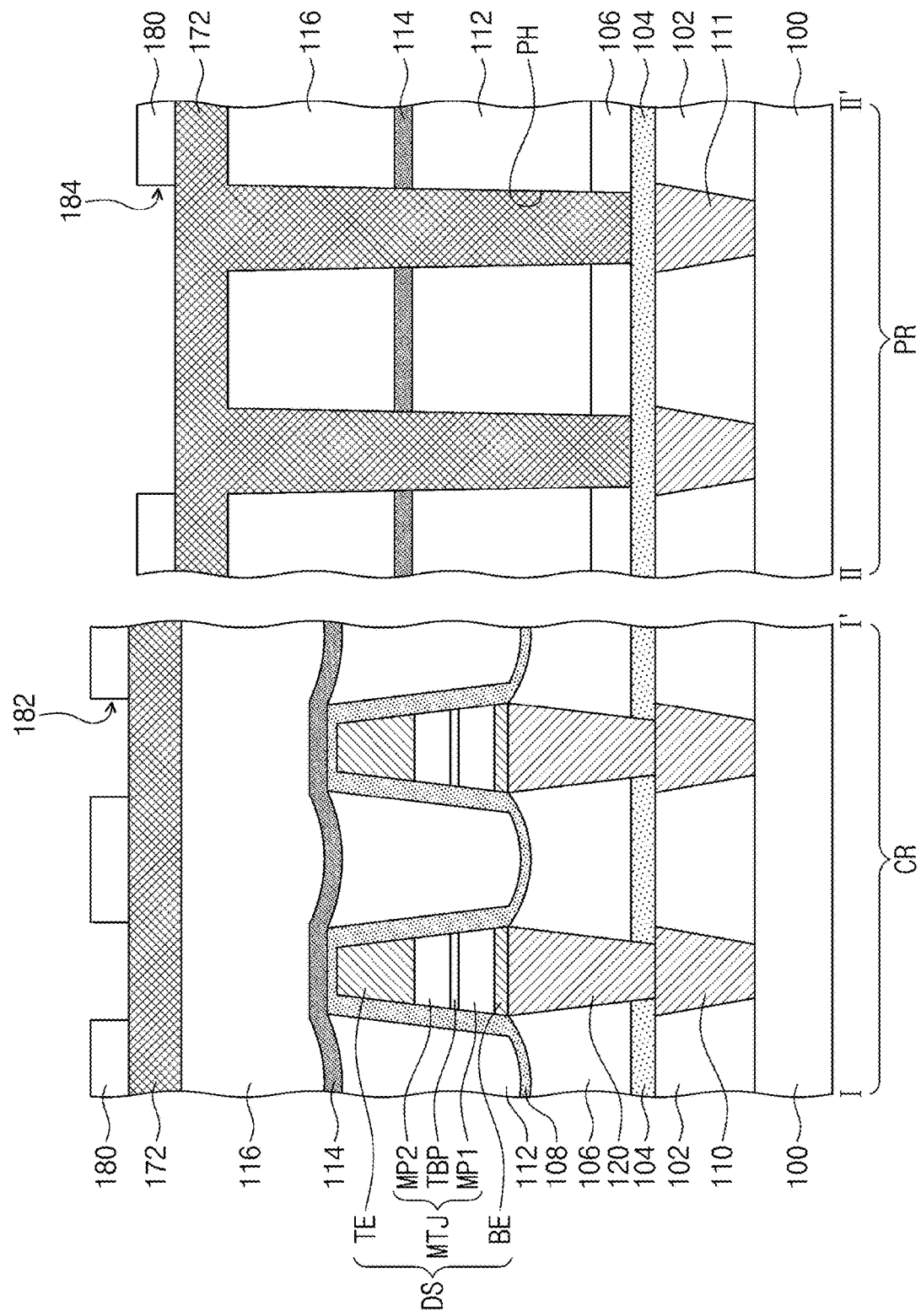

Referring to FIG. 11, a sacrificial layer 172 may be formed on the second upper interlayer insulating layer 116 to fill the preliminary holes PH. The sacrificial layer 172 may cover the second upper interlayer insulating layer 116 on the cell region CR and the peripheral circuit region PR. The sacrificial layer 172 may include, for example, a carbon-containing material.

A mask layer 180 may be formed on the sacrificial layer 172. The mask layer 180 may include cell openings 182 exposing a top surface of the sacrificial layer 172 on the cell region CR, and a peripheral opening 184 exposing a top surface of the sacrificial layer 172 on the peripheral circuit region PR. The cell opening 182 may define a region in which a cell interconnection structure will be formed, and the peripheral opening 184 may define a region in which a peripheral interconnection structure will be formed. The peripheral opening 184 may overlap with the preliminary holes PH when viewed in a plan view. The mask layer 180 may include a material having an etch selectivity with respect to the sacrificial layer 172, the first and second upper interlayer insulating layers 112 and 116, the second etch stop layer 114, the protective insulating layer 108, the first lower interlayer insulating layer 106, and the first etch stop layer 104. The mask layer 180 may include a photoresist material or may include at least one of an oxide, a nitride, or an oxynitride.

Figure 12:
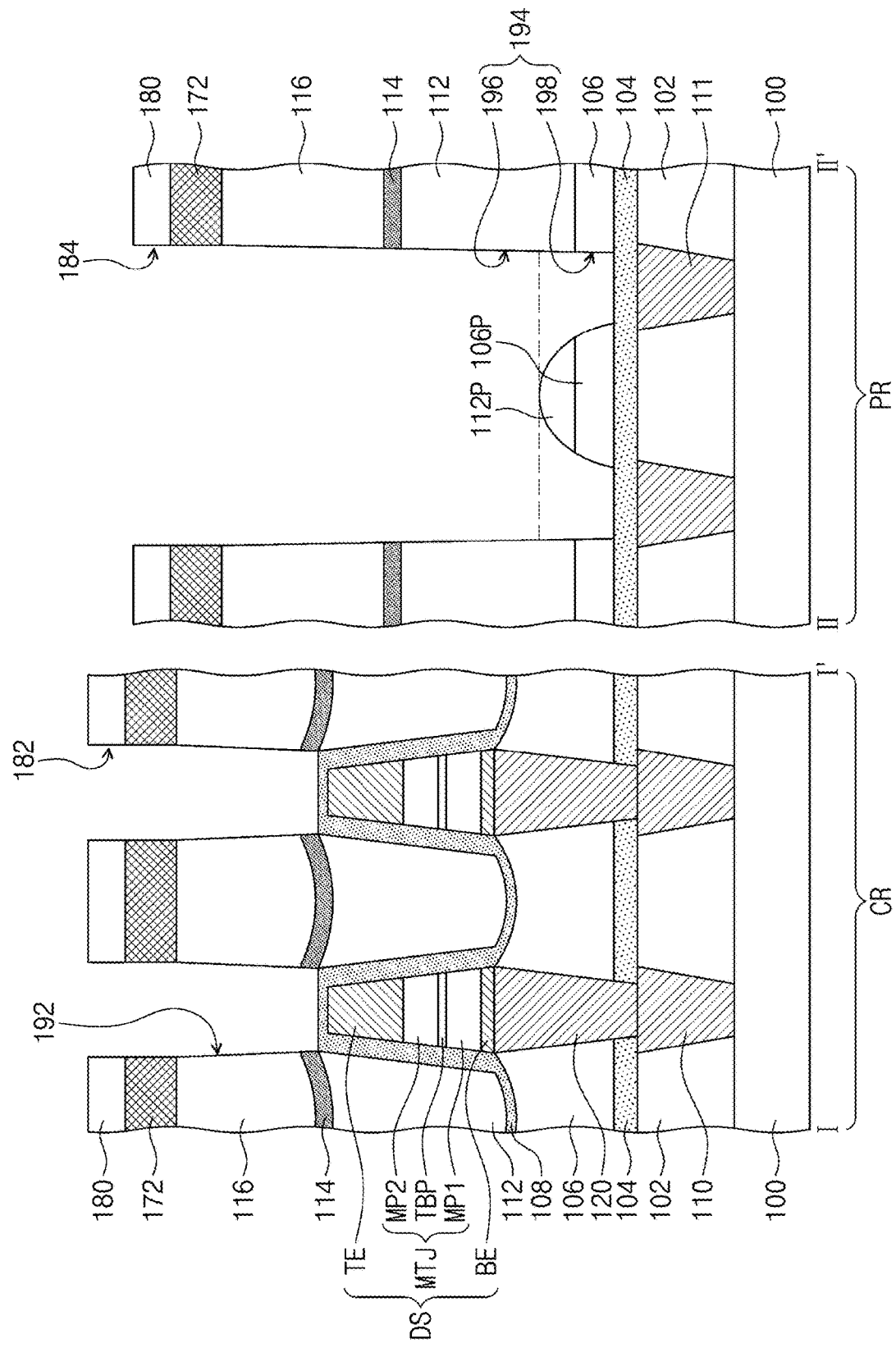

Referring to FIG. 12, a first etching process using the mask layer 180 as an etch mask may be performed. The sacrificial layer 172 and the second upper interlayer insulating layer 116 on the cell region CR may be patterned by the first etching process, and thus cell trenches 192 may be formed in the second upper interlayer insulating layer 116. The second etch stop layer 114 on the cell region CR may be patterned by the first etching process, and thus the cell trenches 192 may extend into the second etch stop layer 114. The first etching process may be performed to expose a top surface of the protective insulating layer 108 on the cell region CR. The cell trenches 192 may extend in a direction (e.g., the first direction D1) parallel to the top surface 100U of the substrate 100.

The sacrificial layer 172, the second upper interlayer insulating layer 116, the second etch stop layer 114, the first upper interlayer insulating layer 112 and the first lower interlayer insulating layer 106 on the peripheral circuit region PR may be patterned by the first etching process.

Thus, a through-hole 194 penetrating the second upper interlayer insulating layer 116, the second etch stop layer 114, the first upper interlayer insulating layer 112 and the first lower interlayer insulating layer 106 may be formed on the peripheral circuit region PR. The through-hole 194 may include a peripheral trench 196 extending in a direction (e.g., the first direction D1) parallel to the top surface 100U of the substrate 100, and contact holes 198 extending from the peripheral trench 196 toward the substrate 100. The contact holes 198 may be horizontally spaced apart from each other, and the peripheral trench 196 may be connected in common to the contact holes 198. The peripheral trench 196 may penetrate the second upper interlayer insulating layer 116, the second etch stop layer 114, and an upper portion of the first upper interlayer insulating layer 112. Each of the contact holes 198 may penetrate a lower portion of the first upper interlayer insulating layer 112 and the first lower interlayer insulating layer 106. The first etching process may be performed until the first etch stop layer 104 on the peripheral circuit region PR is exposed. Thus, each of the contact holes 198 may expose a top surface of the first etch stop layer 104.

Referring to FIG. 12, during the first etching process, an etch rate of the sacrificial layer 172 may be greater than etch rates of the second upper interlayer insulating layer 116, the second etch stop layer 114, the first upper interlayer insulating layer 112, the protective insulating layer 108 and the first lower interlayer insulating layer 106. Since the sacrificial layer 172 is etched by the first etching process, the top surface of the second upper interlayer insulating layer 116 on the cell region CR and the peripheral circuit region PR may be exposed in the first etching process. In addition, since the sacrificial layer 172 filling the preliminary holes PH is etched by the first etching process, sidewalls of the first and second upper interlayer insulating layers 112 and 116, the second etch stop layer 114 and the first lower interlayer insulating layer 106 on the peripheral circuit region PR may be exposed in the first etching process.

In other words, on the cell region CR, only the top surface of the second upper interlayer insulating layer 116 may be exposed to an etch source of the first etching process. In contrast, on the peripheral circuit region PR, the top surface of the second upper interlayer insulating layer 116 and the sidewalls of the first and second upper interlayer insulating layers 112 and 116, the second etch stop layer 114 and the first lower interlayer insulating layer 106 may be sufficiently exposed to the etch source of the first etching process.

In this case, the second upper interlayer insulating layer 116, the second etch stop layer 114, the first upper interlayer insulating layer 112 and the first lower interlayer insulating layer 106 on the peripheral circuit region PR may be etched by the first etching process while the second upper interlayer insulating layer 116 and the second etch stop layer 114 on the cell region CR are etched by the first etching process.

The etch rate of the protective insulating layer 108 may be less than the etch rate of the first lower interlayer insulating layer 106. Since the protective insulating layer 108 on the peripheral circuit region PR is removed by the etch-back process in FIG. 9, the first lower interlayer insulating layer 106 may be etched more for the same time than a case in which the protective insulating layer 108 exists. In other words, the peripheral trench 196 may be formed to be closer to the substrate 100 while the second etch stop layer 114 on the cell region CR is etched, and thus depths of the contact holes 198 may be reduced.

On the peripheral circuit region PR, a portion 112P of the first upper interlayer insulating layer 112 and a portion 106P of the first lower interlayer insulating layer 106 may not be etched by the first etching process but may remain between the contact holes 198. The remaining portion 112P of the first upper interlayer insulating layer 112 and the remaining portion 106P of the first lower interlayer insulating layer 106 may be referred to as a first upper interlayer insulating pattern 112P and a first lower interlayer insulating pattern 106P, respectively.

In the first etching process, etch rates of sidewall portions of the first upper interlayer insulating layer 112 and the first lower interlayer insulating layer 106 may be higher than etch rates of top surface portions thereof, on the peripheral circuit region PR. As a result, a width of the first upper interlayer insulating pattern 112P and the first lower interlayer insulating pattern 106P may decrease as a vertical distance of the first upper interlayer insulating pattern 112P and the first lower interlayer insulating pattern 106P from the top surface 100U of the substrate 100 increases. A top surface and a sidewall of the first upper interlayer insulating pattern 112P and a sidewall of the first lower interlayer insulating pattern 106P may constitute a rounded shape.

Figure 13:
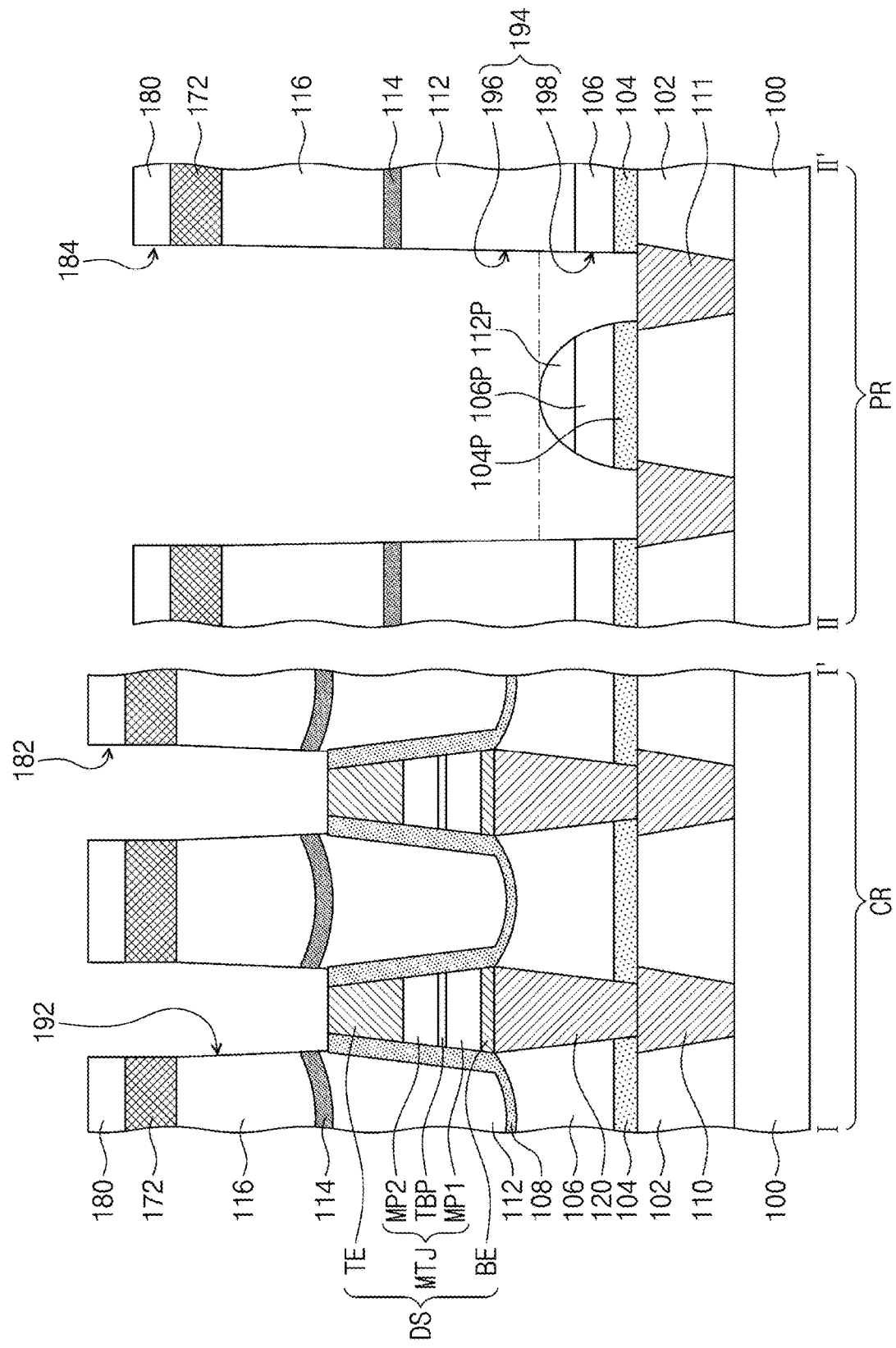

Referring to FIG. 13, a second etching process using the mask layer 180 as an etch mask may be performed. Portions of the protective insulating layer 108 exposed by the cell trenches 192 and portions of the first etch stop layer 104 exposed by the contact holes 198 may be etched by the second etching process. Thus, the cell trenches 192 may extend into the protective insulating layer 108 to expose the top electrodes TE, and the contact holes 198 may extend into the first etch stop layer 104 to expose the peripheral conductive patterns 111, respectively. Thereafter, the mask layer 180 and a remaining portion of the sacrificial layer 172 may be removed. The mask layer 180 and the remaining portion of the sacrificial layer 172 may be removed by, for example, an ashing process and/or a strip process.

On the peripheral circuit region PR, a portion 104P of the first etch stop layer 104 may not be etched by the second etching process but may remain between the contact holes 198. The remaining portion 104P of the first etch stop layer 104 may be referred to as a first etch stop pattern 104P. The first upper interlayer insulating pattern 112P, the first lower interlayer insulating pattern 106P and the first etch stop pattern 104P may be referred to as an insulating pattern INP.

Referring again to FIGS. 3 and 4, cell interconnection structures 130 may be formed in the cell trenches 192 on the cell region CR, respectively, and a peripheral interconnection structure 140 may be formed in the through-hole 194 on the peripheral circuit region PR. The cell interconnection structures 130 may extend in the first direction D1. The peripheral interconnection structure 140 may include a line portion 144 formed in the peripheral trench 196, and contact portions 146 formed in the contact holes 198, respectively. The contact portions 146 may be horizontally spaced apart from each other by the insulating pattern INP.

The formation of the cell interconnection structure 130 and the peripheral interconnection structure 140 may include forming a conductive layer filling the cell trench 192 and the through-hole 194, and planarizing the conductive layer until the top surface of the second upper interlayer insulating layer 116 is exposed. The conductive layer may include a metal (e.g., copper). By the planarization process, a top surface of the cell interconnection structure 130 may be substantially coplanar with the top surface of the second upper interlayer insulating layer 116 on the cell region CR, and a top surface of the peripheral interconnection structure 140 (i.e., a top surface of the line portion 144) may be substantially coplanar with the top surface of the second upper interlayer insulating layer 116 on the peripheral circuit region PR.

Figure 14:
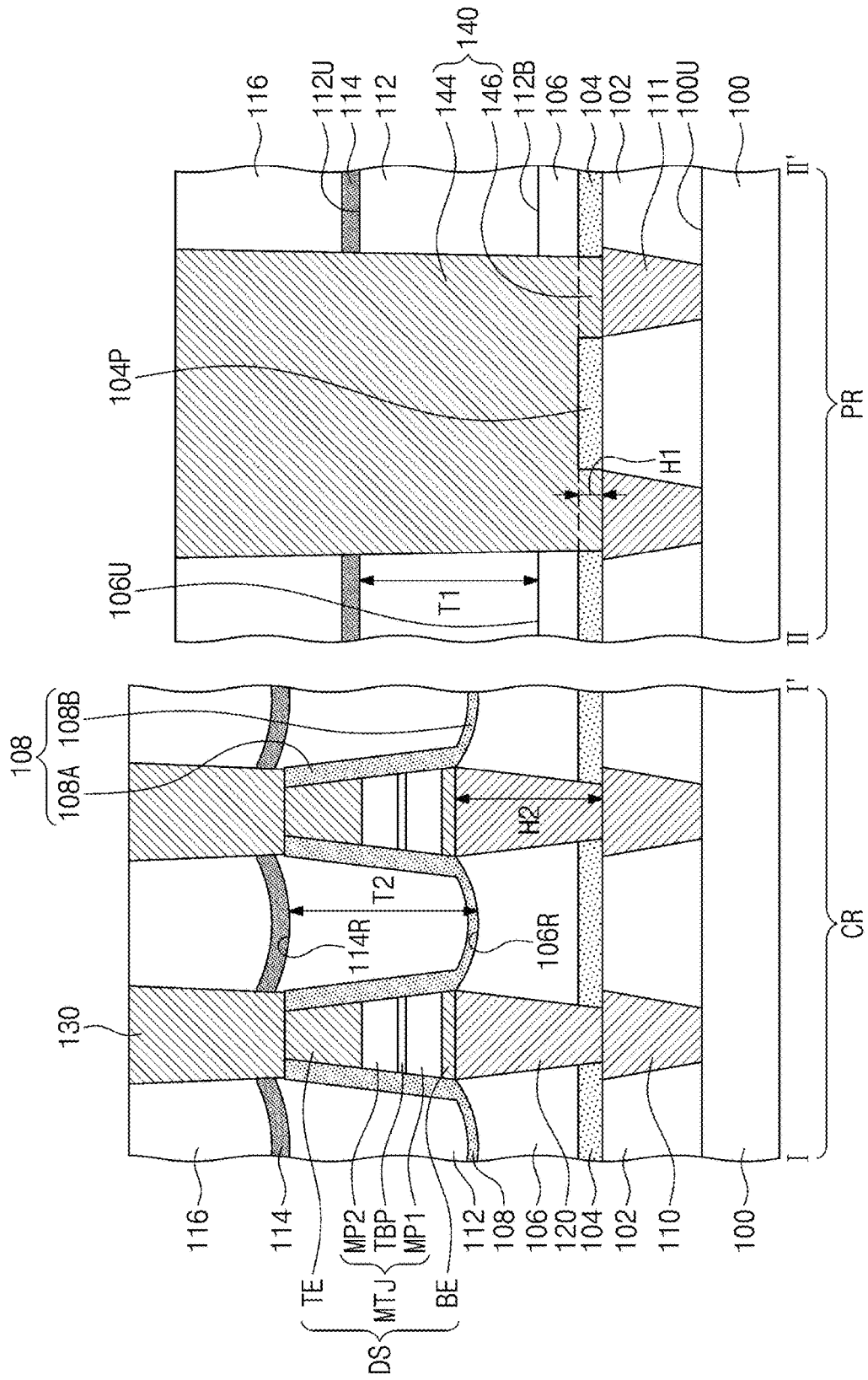
FIG. 14 is a cross-sectional view corresponding to the lines I-I' and II-II' of FIG. 3 to illustrate a magnetic memory device according to some example embodiments of the inventive concepts.

FIG. 14 is a cross-sectional view corresponding to the lines I-I' and II-II' of FIG. 3 to illustrate a magnetic memory device according to some example embodiments of the inventive concepts. Hereinafter, the descriptions to the same features and components as mentioned with reference to FIGS. 3, 4, 5A and 5B will be omitted for the purpose of ease and convenience in explanation.

Referring to FIG. 14, contact portions 146 may be horizontally spaced apart from each other by the first etch stop pattern 104P interposed therebetween. Unlike FIG. 3, the first lower interlayer insulating pattern 106P and the first upper interlayer insulating pattern 112P may not be disposed between the contact portions 146. A height H1 of each of the contact portions 146 may be substantially equal to a thickness of the first etch stop layer 104. A level of a bottom surface of the line portion 144 may be substantially the same as a level of a top surface of the first etch stop layer 104.

Figure 15:
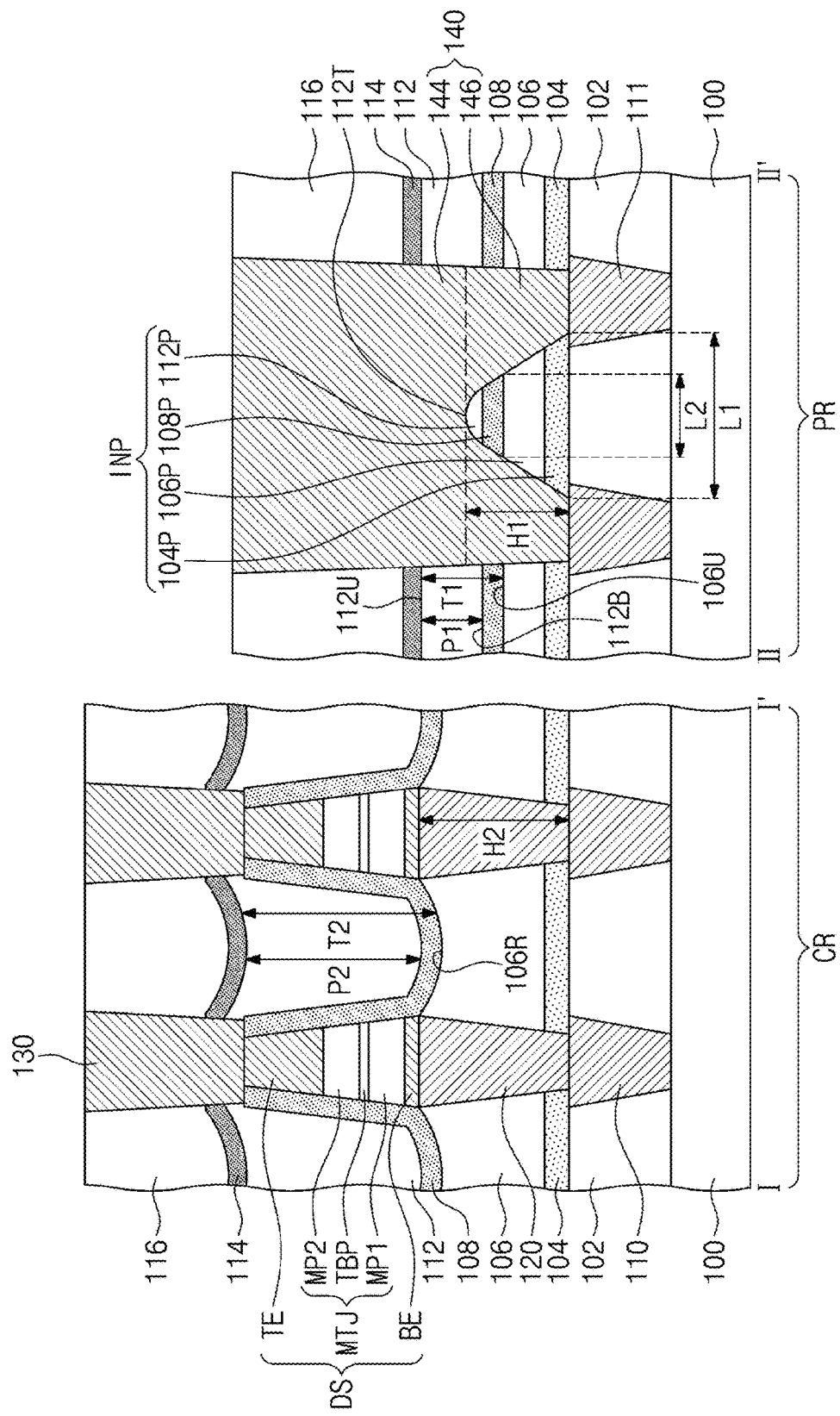
FIG. 15 is a cross-sectional view corresponding to the lines I-I' and II-II' of FIG. 3 to illustrate a magnetic memory device according to some example embodiments of the inventive concepts.

FIG. 15 is a cross-sectional view corresponding to the lines I-I' and II-II' of FIG. 3 to illustrate a magnetic memory device according to some example embodiments of the inventive concepts. Hereinafter, the descriptions to the same features and components as mentioned with reference to FIGS. 3, 4, 5A and 5B will be omitted for the purpose of ease and convenience in explanation.

Referring to FIG. 15, the protective insulating layer 108 may be provided on the cell region CR and the peripheral circuit region PR of the substrate 100. The protective insulating layer 108 may conformally cover the recessed top surface 106R of the first lower interlayer insulating layer 106 between the data storage structures DS and may extend along the top surface 106U of the first lower interlayer insulating layer 106 on the peripheral circuit region PR. As shown in FIG. 15, the protective insulating layer 108 may extend (e.g., in a thickness direction, which may be the vertical direction extending perpendicular to the top surface 100U of the substrate 100) between the top surface 106U of the first lower interlayer insulating layer 106 and the first upper interlayer insulating layer 112 on the peripheral circuit region PR. On the peripheral circuit region PR, the first upper interlayer insulating layer 112 may be provided on the first lower interlayer insulating layer 106 and the protective insulating layer 108 may be disposed between the first upper interlayer insulating layer 112 and the first lower interlayer insulating layer 106.

A thickness P1 of the first upper interlayer insulating layer 112 on the peripheral circuit region PR may be less than a thickness P2 of the first upper interlayer insulating layer 112 on the cell region CR. For example, the thickness P2 of the first upper interlayer insulating layer 112 on the cell region CR may be a maximum value of a distance between a recessed top surface of the first upper interlayer insulating layer 112 and a protruding bottom surface of the first upper interlayer insulating layer 112.

A vertical distance T1 between the top surface of the first lower interlayer insulating layer 106 and the top surface 112U of the first upper interlayer insulating layer 112 on the peripheral circuit region PR may be less than the maximum value T2 of the distance between the recessed top surface of the first lower interlayer insulating layer 106 and the recessed top surface of the first upper interlayer insulating layer 112 vertically adjacent thereto on the cell region CR. This may be because the thickness P1 of the first upper interlayer insulating layer 112 on the peripheral circuit region PR is less than the thickness P2 of the first upper interlayer insulating layer 112 on the cell region CR.

As shown in FIG. 15, the peripheral interconnection structure 140 may penetrate the protective insulating layer 108 between the first upper interlayer insulating layer 112 and the first lower interlayer insulating layer 106 on the peripheral circuit region PR. Each of the contact portions 146 may penetrate a lower portion of the first upper interlayer insulating layer 112, the protective insulating layer 108, the first lower interlayer insulating layer 106 and the first etch stop layer 104 on the peripheral circuit region PR. As shown in FIG. 15, an insulating pattern INP may include some or all of a first upper interlayer insulating pattern 112P, which is a portion of the first upper interlayer insulating pattern 112, a protective insulating pattern 108P, which is a portion of the protective insulating layer 108, a first lower interlayer insulating pattern 106P, which is a portion of the first lower interlayer insulating layer 106, and a first etch stop pattern 104P, which is a portion of the first etch stop layer 104. As shown in FIG. 15, the protective insulating pattern 108P is between the first upper interlayer insulating pattern 112P and the first lower interlayer insulating pattern 106P in the insulating pattern INP according to some example embodiments. As shown in FIG. 15, the first etch stop pattern 104P and the protective insulating pattern 108P has respective widths L1 and L2 in the first direction D1 that is parallel to the top surface 100U of the substrate 100, and the width L1 of the first etch stop pattern 104P in the first direction D1 may be equal to or greater than twice the width L2 of the protective insulating pattern 108P in the first direction D1.

A level of the top 112T of the insulating pattern INP may be located in the first upper interlayer insulating layer 112 on the peripheral circuit region PR. The top 112T of the insulating pattern INP may be closer to a bottom surface 112B of the first upper interlayer insulating layer 112 than to the top surface 112U of the first upper interlayer insulating layer 112. The level of the top 112T of the insulating pattern INP may correspond to a level of the top of the contact portion 146.

FIGS. 16, 17, 18, 19, and 20 are cross-sectional views corresponding to the lines I-I' and II-II' of FIG. 3 to illustrate a method for manufacturing a magnetic memory device according to some example embodiments of the inventive concepts. Hereinafter, the descriptions to the same technical features as in some example embodiments of FIGS. 6 to 13 will be omitted for the purpose of ease and convenience in explanation.

Figure 16:
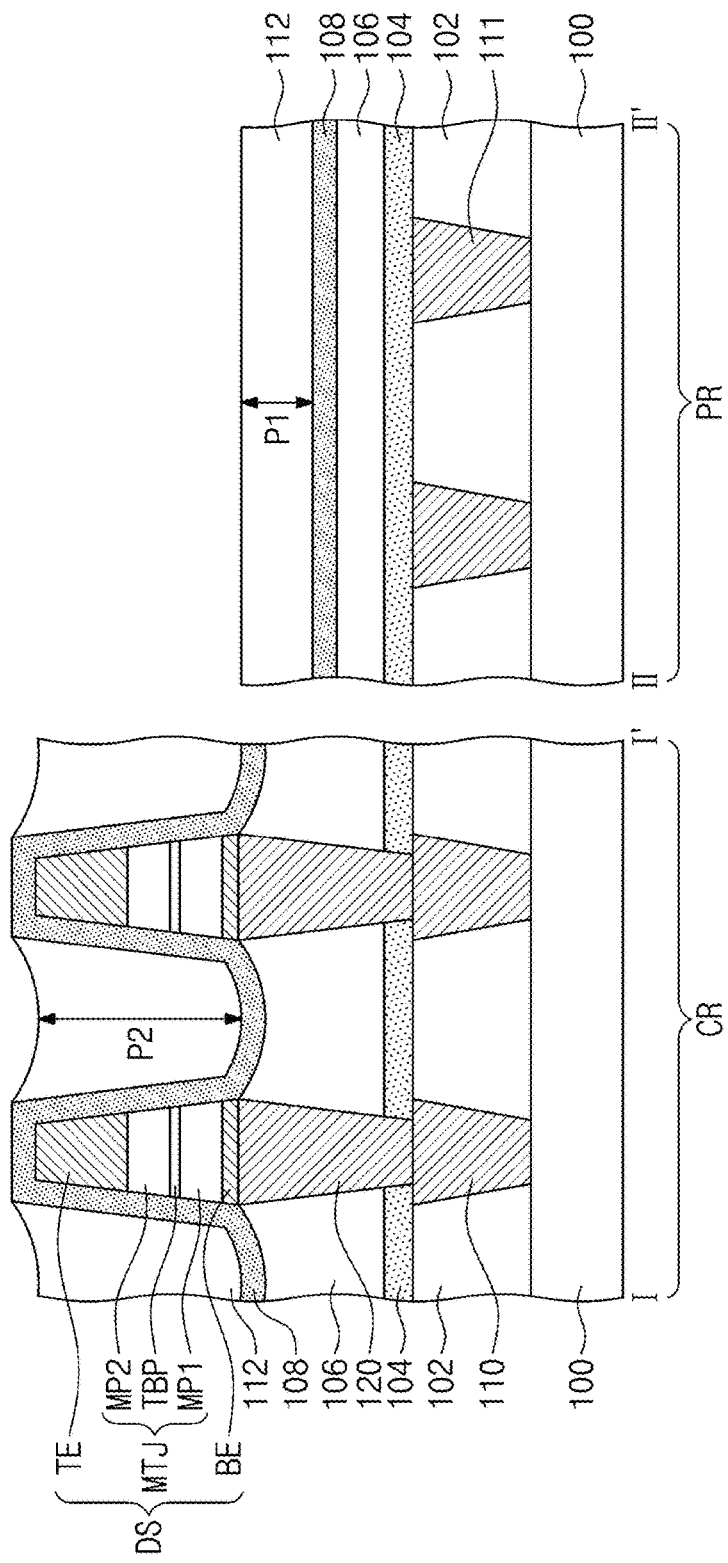
FIGS. 16, 17, 18, 19, and 20 are cross-sectional views corresponding to the lines I-I' and II-II' of FIG. 3 to illustrate a method for manufacturing a magnetic memory device according to some example embodiments of the inventive concepts.

Referring to FIGS. 8 and 16, a first upper interlayer insulating layer 112 may be formed on the protective insulating layer 108 to fill a space between the plurality of data storage structures DS. The first upper interlayer insulating layer 112 may cover the protective insulating layer 108 on the peripheral circuit region PR.

A thickness P1 of the first upper interlayer insulating layer 112 formed on the peripheral circuit region PR may be less than a thickness P2 of the first upper interlayer insulating layer 112 formed on the cell region CR. For example, the thickness P1 of the first upper interlayer insulating layer 112 formed on the peripheral circuit region PR may be ½ of the thickness P2 of the first upper interlayer insulating layer 112 formed on the cell region CR. The first upper interlayer insulating layer 112 may be formed by a CVD process, a PVD process, or an ALD process.

Figure 17:
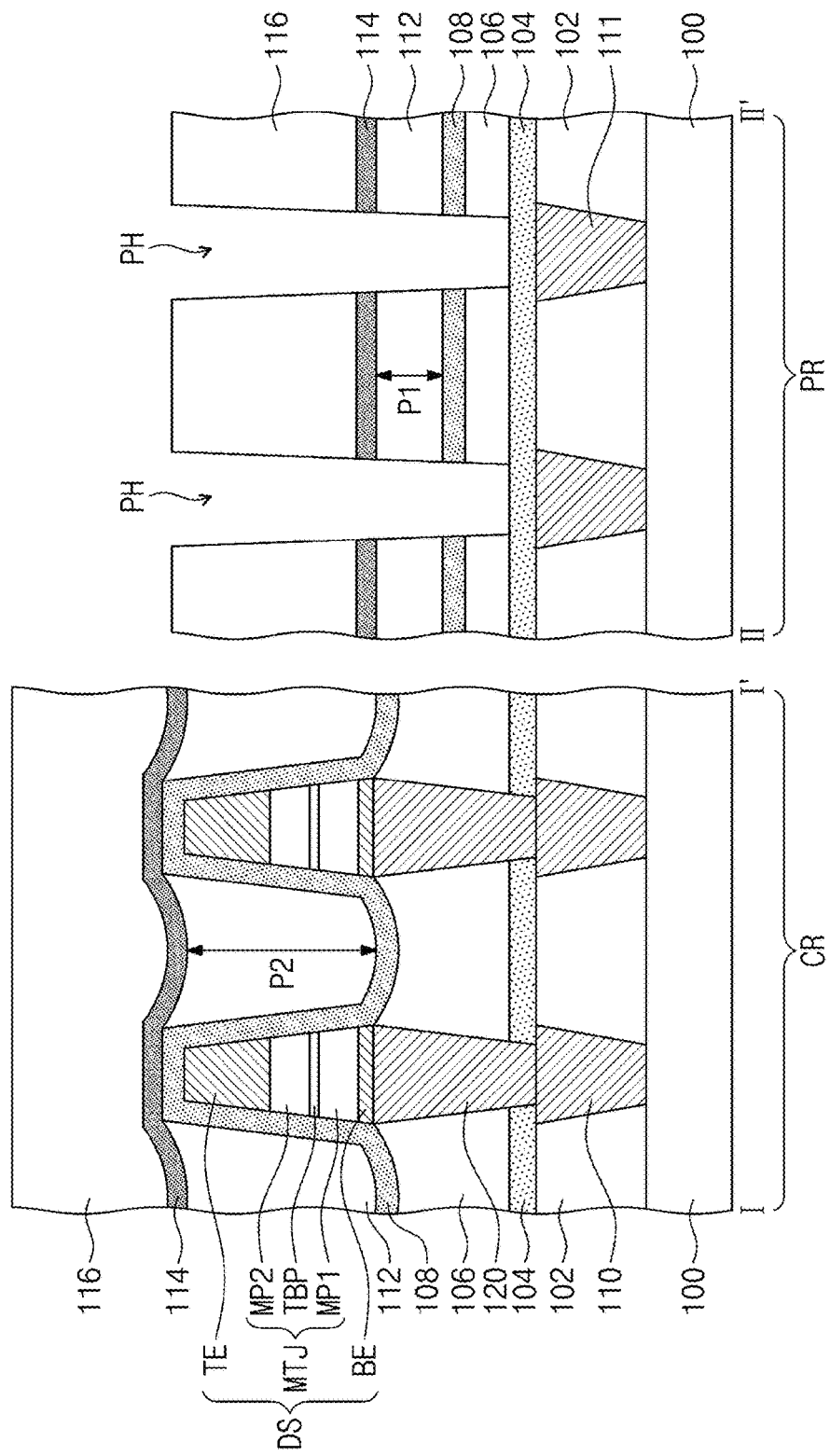

Referring to FIG. 17, the second etch stop layer 114 and the second upper interlayer insulating layer 116 may be sequentially formed on the first upper interlayer insulating layer 112, and preliminary holes PH may be formed on the peripheral circuit region PR of the substrate 100. Each of the preliminary holes PH may penetrate the second upper interlayer insulating layer 116, the second etch stop layer 114, the first upper interlayer insulating layer 112, the protective insulating layer 108, and the first lower interlayer insulating layer 106 to expose the top surface of the first etch stop layer 104. The formation of the preliminary holes PH may include sequentially etching the second upper interlayer insulating layer 116, the second etch stop layer 114, the first upper interlayer insulating layer 112, the protective insulating layer 108, and the first lower interlayer insulating layer 106 by using a mask pattern (not shown) as an etch mask. Thereafter, the mask pattern may be removed.

Figure 18:
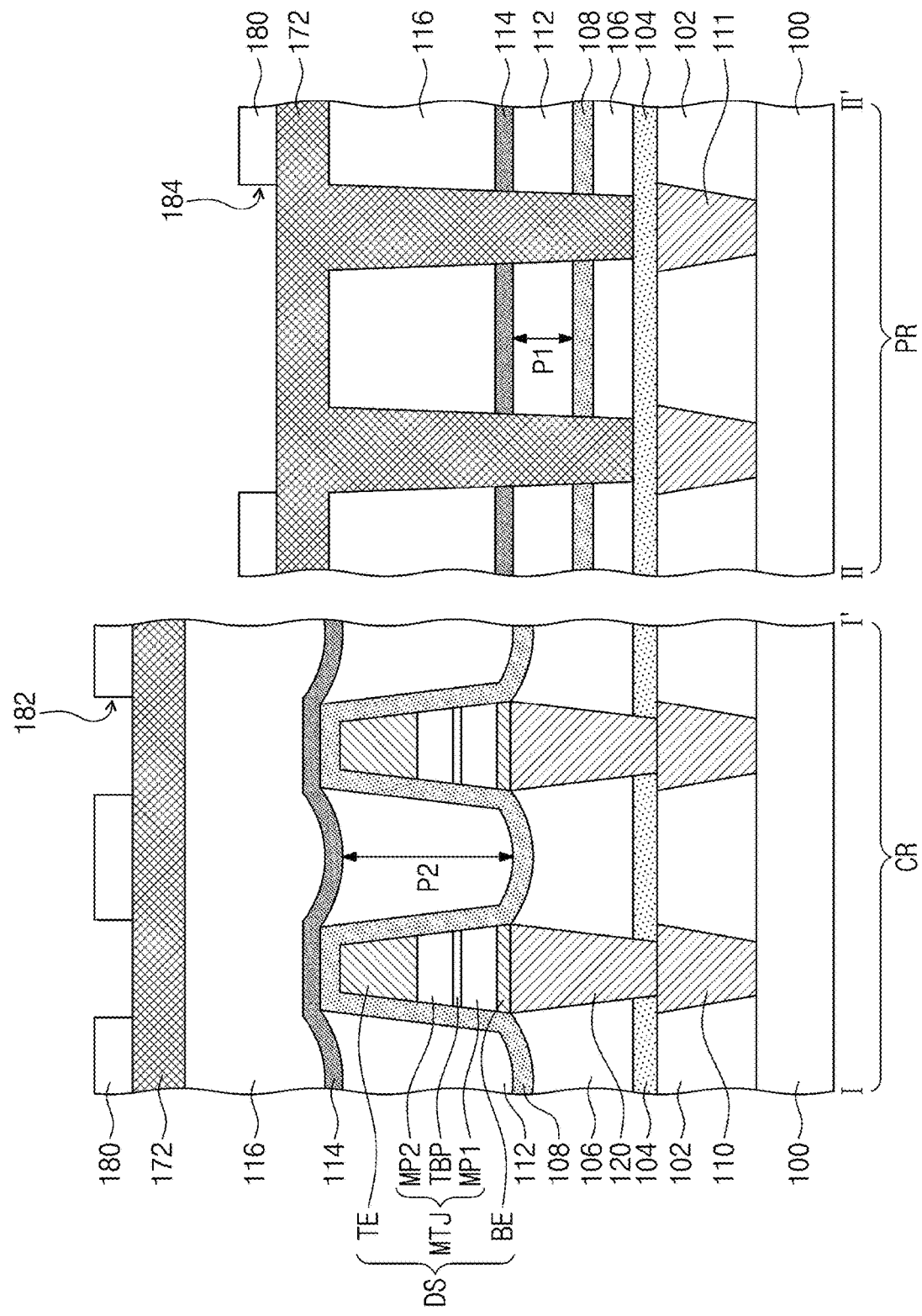

Referring to FIG. 18, the sacrificial layer 172 may be formed on the second upper interlayer insulating layer 116 to fill the preliminary holes PH. The sacrificial layer 172 may cover the second upper interlayer insulating layer 116 on the cell region CR and the peripheral circuit region PR. The mask layer 180 may be formed on the sacrificial layer 172.

Figure 19:
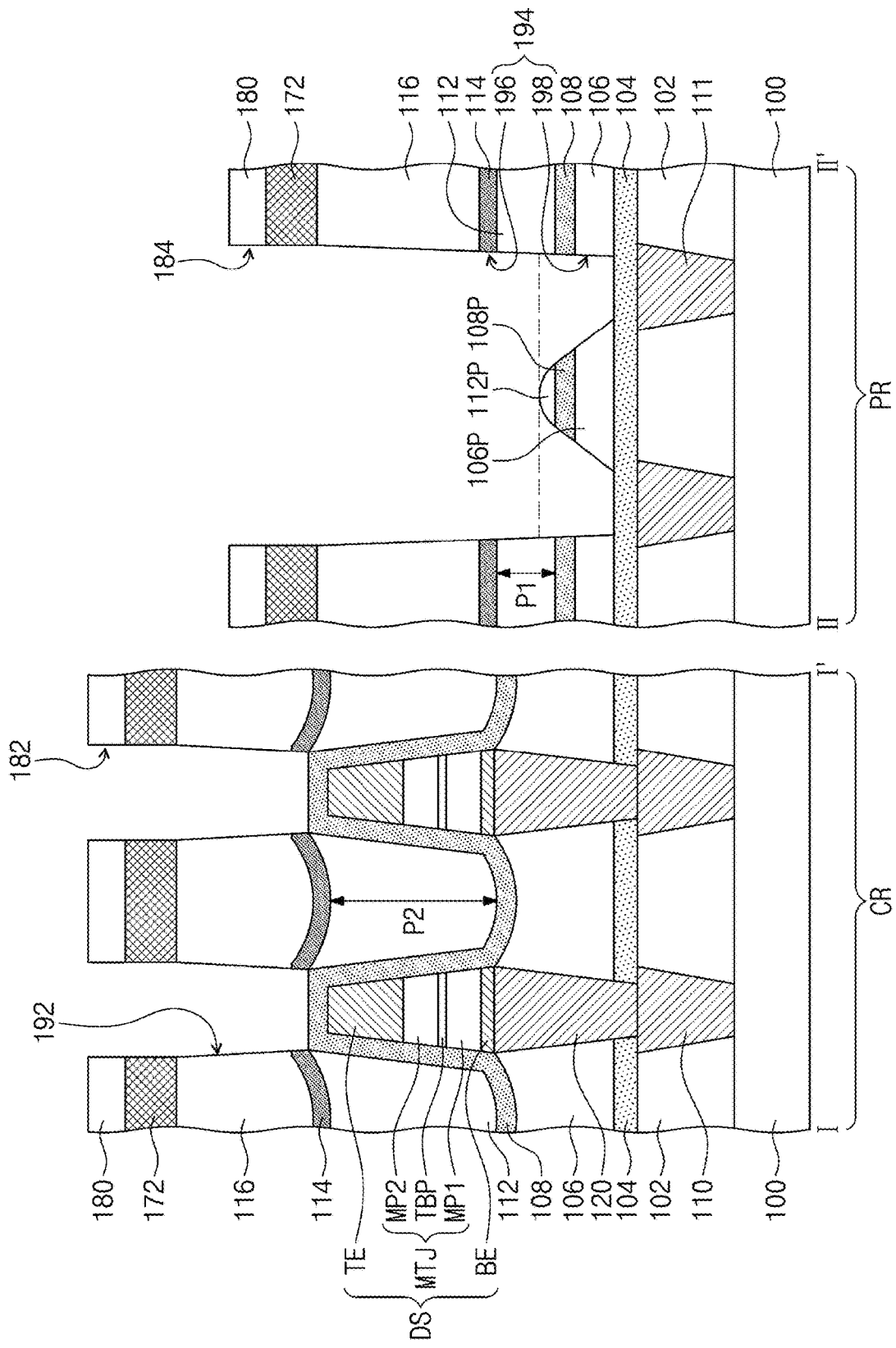

Referring to FIG. 19, the first etching process using the mask layer 180 as an etch mask may be performed. On the peripheral circuit region PR, a portion 112P of the first upper interlayer insulating layer 112, a portion 108P of the protective insulating layer 108 and a portion 106P of the first lower interlayer insulating layer 106 may not be etched by the first etching process but may remain between the contact holes 198. Since the thickness P1 of the first upper interlayer insulating layer 112 on the peripheral circuit region PR is small, the peripheral trench 196 may be formed to be closer to the top surface of the first etch stop layer 104 than a case in which the thickness P1 of the first upper interlayer insulating layer 112 on the peripheral circuit region PR is great.

Figure 20:
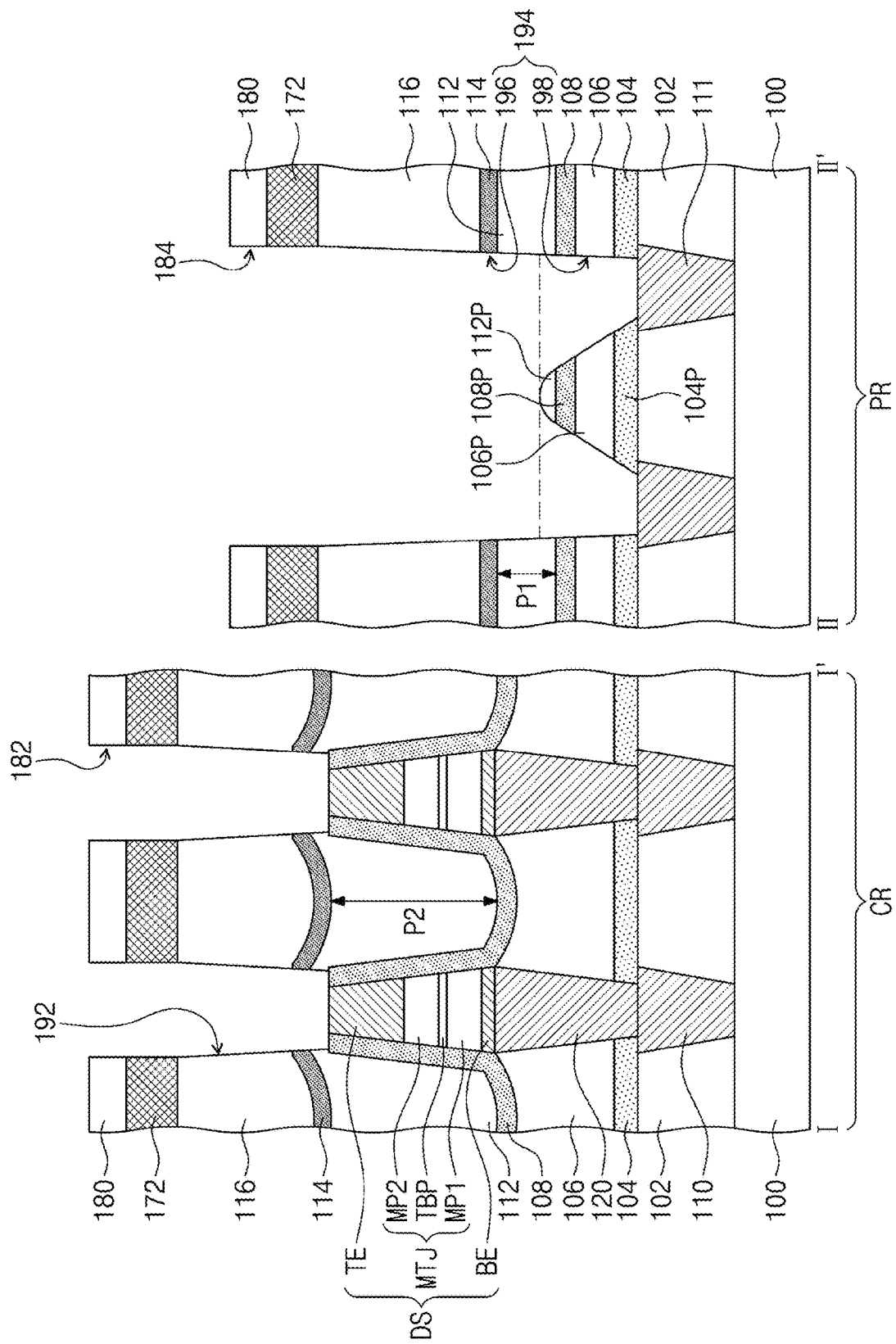

Referring to FIG. 20, the second etching process using the mask layer 180 as an etch mask may be performed. On the peripheral circuit region PR, a portion 104P of the first etch stop layer 104 may not be etched by the second etching process but may remain between the contact holes 198.

Referring again to FIGS. 3 and 15, cell interconnection structures 130 may be formed in the cell trenches 192 on the cell region CR, respectively, and a peripheral interconnection structure 140 may be formed in the through-hole 194 on the peripheral circuit region PR.

According to some example embodiments of the inventive concepts, the contact hole having a small aspect ratio may be formed on the peripheral circuit region. The conductive layer may easily fill the contact hole having the small aspect ratio. In this case, the contact portion may be easily formed, and it is possible to minimize defects which may be generated when filling the contact hole with the conductive layer. Thus, the magnetic memory device with improved electrical characteristics may be easily manufactured.

According to some example embodiments of the inventive concepts, the through-hole on the peripheral circuit region may have a small aspect ratio. Since the through-hole has the small aspect ratio, a conductive layer may easily fill the through-hole. In this case, the peripheral interconnection structure may be easily formed in the through-hole, and defects generated in the peripheral interconnection structure may be minimized. Thus, the magnetic memory device with improved electrical characteristics may be easily manufactured.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device, comprising:
    a substrate including a cell region and a peripheral circuit region;
    lower contact plugs on the cell region;
    data storage structures on the lower contact plugs; and
    a peripheral interconnection structure on the peripheral circuit region,
    wherein the peripheral interconnection structure includes
        a line portion extending in a direction parallel to a top surface of the substrate, and
        contact portions extending from the line portion toward the substrate,
    wherein a height of each of the contact portions is less than a height of each of the lower contact plugs.

2. The magnetic memory device of claim 1, wherein a ratio of the height of each of the contact portions to a width of a bottom surface of each of the contact portions is equal to or less than 1.5:1.

3. The magnetic memory device of claim 1, wherein a width of each contact portion of the contact portions increases as a vertical distance of the contact portion from the substrate increases.

4. The magnetic memory device of claim 3, wherein
    the contact portions include a first contact portion and a second contact portion which are spaced apart from each other such that at least respective bottom surfaces of the first contact portion and the second contact portion are isolated from direct contact with each other,
    the first contact portion has a first sidewall and a second sidewall opposite to the first sidewall,
    the second sidewall is proximate to the second contact portion in relation to the first sidewall, and
    an average gradient of the second sidewall is less than an average gradient of the first sidewall.

5. The magnetic memory device of claim 4, wherein a gradient of the second sidewall decreases as a vertical distance of the second sidewall from the top surface of the substrate increases.

6. The magnetic memory device of claim 1, further comprising:
    a protective insulating layer covering a sidewall of each of the data storage structures on the cell region and exposing a top surface of each of the data storage structures, wherein the protective insulating layer is not on the peripheral circuit region.

7. The magnetic memory device of claim 6, further comprising:
    a first lower interlayer insulating layer beneath bottom surfaces of the data storage structures,
    wherein the lower contact plugs on the cell region penetrate the first lower interlayer insulating layer,
    wherein the first lower interlayer insulating layer has a recessed top surface between adjacent data storage structures,
    wherein the protective insulating layer extends onto the recessed top surface of the first lower interlayer insulating layer,
    wherein a thickness of the protective insulating layer on the sidewall of each of the data storage structures is greater than a thickness of the protective insulating layer on the recessed top surface of the first lower interlayer insulating layer.

8. The magnetic memory device of claim 7, further comprising:
    a first upper interlayer insulating layer on the first lower interlayer insulating layer,
    wherein the protective insulating layer is between the first lower interlayer insulating layer and the first upper interlayer insulating layer.

9. The magnetic memory device of claim 8, further comprising:
    a second upper interlayer insulating layer on the first upper interlayer insulating layer; and
    an etch stop layer between the first upper interlayer insulating layer and the second upper interlayer insulating layer,
    wherein each of the second upper interlayer insulating layer and the etch stop layer cover the cell region and the peripheral circuit region,
    wherein the line portion penetrates the second upper interlayer insulating layer and the etch stop layer.

10. The magnetic memory device of claim 1, further comprising:
    a sequential stack of a first lower interlayer insulating layer, a protective insulating layer, and a first upper interlayer insulating layer on the substrate,
    wherein the protective insulating layer covers a sidewall of each of the data storage structures,
    wherein the first upper interlayer insulating layer on the cell region has a recessed top surface and a protruding bottom surface,
    wherein a thickness of the first upper interlayer insulating layer on the peripheral circuit region is less than a distance between the recessed top surface and the protruding bottom surface of the first upper interlayer insulating layer on the cell region.

11. A magnetic memory device comprising:
a substrate including a cell region and a peripheral circuit region;
an etch stop layer on the cell region and the peripheral circuit region;
a first lower interlayer insulating layer on the etch stop layer;
a data storage structure on the first lower interlayer insulating layer on the cell region;
a first upper interlayer insulating layer on the cell region and the peripheral circuit region and covering the data storage structure;
a protective insulating layer between a sidewall of the data storage structure and the first upper interlayer insulating layer and between a top surface of the first lower interlayer insulating layer and the first upper interlayer insulating layer on the cell region; and
a peripheral interconnection structure penetrating the first upper interlayer insulating layer and the first lower interlayer insulating layer on the peripheral circuit region,
wherein the peripheral interconnection structure includes
a line portion extending in a horizontal direction parallel to a top surface of the substrate, and
contact portions extending from the line portion toward the substrate,
wherein the contact portions are spaced apart from each other in the horizontal direction by an insulating pattern therebetween, and the insulating pattern includes a portion of the first upper interlayer insulating layer, a portion of the first lower interlayer insulating layer, and a portion of the etch stop layer,
wherein the first lower interlayer insulating layer and the first upper interlayer insulating layer on the cell region have recessed top surfaces,
wherein a distance between a top surface of the first lower interlayer insulating layer and a top surface of the first upper interlayer insulating layer on the peripheral circuit region is less than a maximum value of a distance between the recessed top surface of the first lower interlayer insulating layer and the recessed top surface of the first upper interlayer insulating layer on the cell region.

12. The magnetic memory device of claim 11, wherein
the protective insulating layer extends between the top surface of the first lower interlayer insulating layer and the first upper interlayer insulating layer on the peripheral circuit region,
the peripheral interconnection structure penetrates the protective insulating layer between the first upper interlayer insulating layer and the first lower interlayer insulating layer on the peripheral circuit region, and
the insulating pattern further includes a portion of the protective insulating layer, which is between the portion of the first upper interlayer insulating layer and the portion of the first lower interlayer insulating layer.

13. The magnetic memory device of claim 12, wherein
the portion of the etch stop layer and the portion of the protective insulating layer have respective widths in the horizontal direction, and
the width of the portion of the etch stop layer is equal to or greater than twice the width of the portion of the protective insulating layer.

14. The magnetic memory device of claim 12, wherein the protective insulating layer includes a different total material composition from both a total material composition of the first upper interlayer insulating layer and a total material composition of the first lower interlayer insulating layer.

15. The magnetic memory device of claim 11, wherein
the top surface of the first lower interlayer insulating layer on the peripheral circuit region and a bottom surface of the first upper interlayer insulating layer on the peripheral circuit region are in contact with each other, and
the first lower interlayer insulating layer and the first upper interlayer insulating layer include a same material.

16. A magnetic memory device, comprising:
a substrate including a cell region and a peripheral circuit region;
a first lower interlayer insulating layer on the cell region and the peripheral circuit region;
a data storage structure on the first lower interlayer insulating layer on the cell region;
a first upper interlayer insulating layer on the cell region and the peripheral circuit region and covering the data storage structure;
a protective insulating layer between a sidewall of the data storage structure and the first upper interlayer insulating layer and between a top surface of the first lower interlayer insulating layer and the first upper interlayer insulating layer on the cell region; and
a peripheral interconnection structure penetrating the first upper interlayer insulating layer and the first lower interlayer insulating layer on the peripheral circuit region,
wherein the peripheral interconnection structure includes
a line portion extending in a horizontal direction parallel to a top surface of the substrate, and
contact portions extending from the line portion toward the substrate,
wherein the contact portions are spaced apart from each other in the horizontal direction by an insulating pattern therebetween, and the insulating pattern includes a portion of the first upper interlayer insulating layer and a portion of the first lower interlayer insulating layer,
wherein a level of a top of the portion of the first upper interlayer insulating layer is closer to a level of a bottom surface of the first upper interlayer insulating layer adjacent to the peripheral interconnection structure than to a level of a top surface of the first upper interlayer insulating layer adjacent to the peripheral interconnection structure.

17. The magnetic memory device of claim 16, wherein a ratio of a height of each of the contact portions to a width of a bottom surface of each of the contact portions is equal to or less than 1.5:1.

18. The magnetic memory device of claim 16, wherein a width of each contact portion of the contact portions increases as a vertical distance of the contact portion from the substrate increases.

19. The magnetic memory device of claim 18, wherein
the contact portions include a first contact portion and a second contact portion which are spaced apart from each other such that at least respective bottom surfaces of the first contact portion and the second contact portion are isolated from direct contact with each other,
the first contact portion has a first sidewall and a second sidewall opposite to the first sidewall,
the second sidewall is proximate to the second contact portion in relation to the first sidewall, and
an average gradient of the second sidewall is less than an average gradient of the first sidewall.

20. The magnetic memory device of claim 19, wherein a gradient of the second sidewall decreases as a vertical distance of the second sidewall from the top surface of the substrate increases.

* * * * *